(12) United States Patent
Obata et al.

(10) Patent No.: US 9,358,804 B2
(45) Date of Patent: Jun. 7, 2016

(54) FINE WIRING PATTERN, MANUFACTURING METHOD THEREOF, AND THERMAL PRINT HEAD

(71) Applicant: ROHM CO., LTD., Kyoto (JP)

(72) Inventors: Shinobu Obata, Kyoto (JP); Koji Nishi, Kyoto (JP); Takafumi Katsuno, Kyoto (JP); Masumi Okumura, Kyoto (JP); Nobuhito Kinoshita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/610,330

(22) Filed: Jan. 30, 2015

(65) Prior Publication Data

US 2015/0138298 A1 May 21, 2015

Related U.S. Application Data

(62) Division of application No. 13/747,703, filed on Jan. 23, 2013, now Pat. No. 8,982,169.

(30) Foreign Application Priority Data

Jan. 25, 2012 (JP) .................................. 2012-12936
May 28, 2012 (JP) ................................ 2012-120888

(51) Int. Cl.
*B41J 2/05* (2006.01)
(Continued)

(52) U.S. Cl.
CPC ............ *B41J 2/3352* (2013.01); *B41J 2/04541* (2013.01); *B41J 2/3351* (2013.01); *B41J 2/3353* (2013.01); *B41J 2/3354* (2013.01); *B41J 2/3355* (2013.01); *B41J 2/3357* (2013.01); *B41J 2/3359* (2013.01); *B41J 2/33515* (2013.01); *B41J 2/33545* (2013.01); *H05K 1/09* (2013.01); *H05K 1/092* (2013.01); *H05K 3/06* (2013.01); *H05K 3/40* (2013.01); *H05K 1/0306* (2013.01); *H05K 3/12* (2013.01); *H05K 2201/017* (2013.01); *H05K 2201/035* (2013.01); *H05K 2201/0338* (2013.01)

(58) Field of Classification Search
CPC ...... B41J 2/3353; B41J 2/3357; B41J 2/3359; B41J 2/3355; B41J 2/33515; B41J 2/33525; B41J 2/375
USPC ...................................... 347/200–208; 216/27
See application file for complete search history.

(56) References Cited

U.S. PATENT DOCUMENTS 6,331,868 B1   12/2001   Yamade et al.
6,448,993 B1    9/2002   Hayashi et al.
(Continued)

FOREIGN PATENT DOCUMENTS

JP       2011-240641        12/2011

*Primary Examiner* — An Do
(74) *Attorney, Agent, or Firm* — Hamre, Schumann, Mueller & Larson, P.C.

(57) ABSTRACT

According to the present disclosure, a manufacturing method of a fine wiring pattern is disclosed. The manufacturing method includes preparing a support member, forming a first layer on the support member by thick-film printing, and forming a second layer including Ag on the first layer by the thick-film printing. The method also includes forming a predetermined fine wiring pattern by performing an etching process upon the first layer and the second layer.

24 Claims, 17 Drawing Sheets

(51) Int. Cl.
*B41J 2/335* (2006.01)
*B41J 2/045* (2006.01)
*H05K 3/06* (2006.01)
*H05K 1/09* (2006.01)
*H05K 3/40* (2006.01)
*H05K 3/12* (2006.01)
*H05K 1/03* (2006.01)

(56) References Cited

U.S. PATENT DOCUMENTS 7,484,834 B2 * 2/2009 Inokuma ............... B41J 2/3351
        347/64
7,791,625 B2 * 9/2010 Yamada ............... B41J 2/3353
        347/200

* cited by examiner

FIG. 6
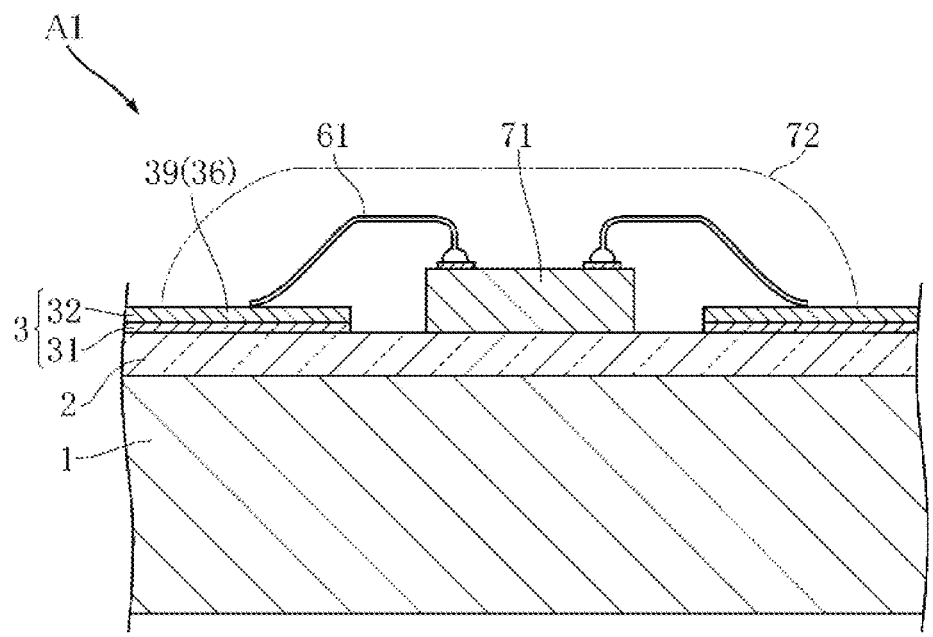
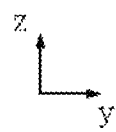
FIG. 7
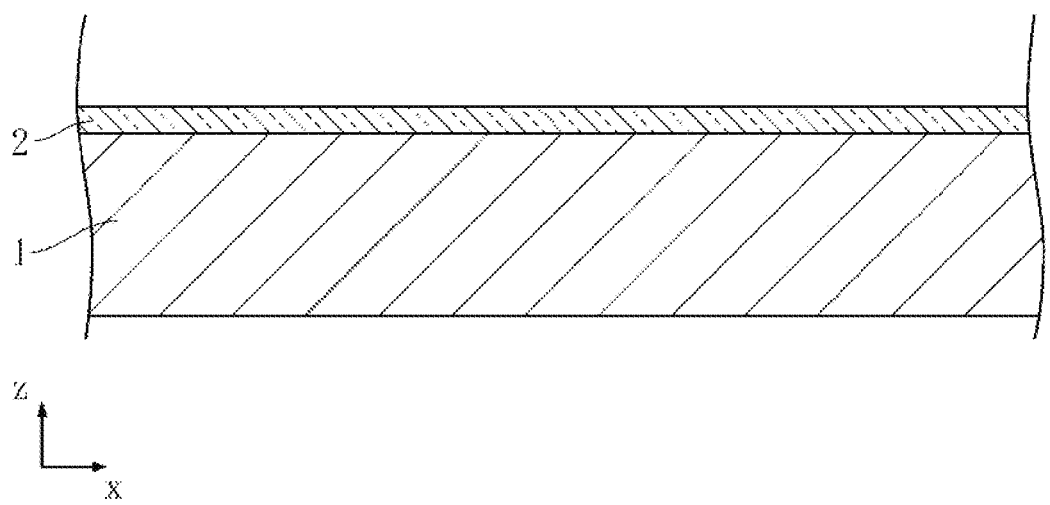

■ thermal conductivity(W/m·k)
● resistance (μΩ/cm)

FINE WIRING PATTERN, MANUFACTURING METHOD THEREOF, AND THERMAL PRINT HEAD

CROSS-REFERENCE TO RELATED APPLICATIONS

This application is a Division of application Ser. No. 13/747,703, filed Jan. 23, 2013, which is based upon and claims the benefit of priority from Japanese Patent Application Nos. 2012-012936, filed on Jan. 25, 2012, and 2012-120888, filed on May 28, 2012, the entire contents of which are incorporated herein by reference.

TECHNICAL FIELD

The present disclosure relates to a fine wiring pattern, a manufacturing method of the fine wiring pattern, and a thermal print head.

BACKGROUND

Conventionally, a thermal print head, which performs a printing operation by applying heat to thermal paper or thermal ink ribbon, has been proposed. For example, a thermal print head including an electrode layer supported on a substrate and a resistor layer partially covering the electrode layer is disclosed. The electrode layer includes a common electrode having a plurality of gaps therebetween, and a plurality of individual electrodes. The resistor layer has a strip shape extending in a primary scanning direction to bridge the plurality of gaps of the electrode layer. The electrode layer is formed by an electrical conductor mainly composed of Au. It is required that the electrode layer is suitably supported on a substrate, a resistance of the electrode layer is reduced, the electrode layer is well contacted with the resistor layer, a wire used to connect an IC for controlling is well bonded, and the like. As a configuration in response to such demand, the electrode layer is formed by an electrical conductor mainly composed of Au.

However, because Au is an expensive material, the manufacturing cost of the thermal print head is increased when Au is selected as a main component of the electrode layer. In order to reduce the manufacturing cost of the thermal print head, it is desired that the demand for the above electrode layer is satisfied and the electrode layer is constructed with a lower cost.

SUMMARY

The present disclosure has been proposed under the circumstances described above. It is therefore an objective of the present disclosure to provide a manufacturing method of a fine wiring pattern, the fine wiring pattern and a thermal print head, which can suppress the manufacturing cost and construct a suitable electrode layer.

A manufacturing method of a fine wiring pattern provided in a first aspect of the present disclosure includes: preparing a support member; forming a first layer on the support member by thick-film printing; forming a second layer including Ag on the first layer by the thick-film printing; and forming a predetermined fine wiring pattern by performing an etching process upon the first layer and the second layer.

In some embodiments of the present disclosure, the fine wiring pattern includes a plurality of wire portions, and a space between the adjacent wire portions is equal to or less than 40 μm.

In some embodiments of the present disclosure, at least one portion of the fine wiring pattern has a wiring width of 25 μm or smaller.

In some embodiments of the present disclosure, the first layer and the second layer include Ag.

In some embodiments of the present disclosure, the first layer is formed thinner than the second layer.

In some embodiments of the present disclosure, the first layer includes Pd.

In some embodiments of the present disclosure, the first layer and the second layer include Pd, and Pd content of the first layer is larger than Pd content of the second layer.

In some embodiments of the present disclosure, the support member includes a substrate made of a ceramic and a glaze layer formed on the substrate.

In some embodiments of the present disclosure, the second layer includes Ag particles.

In some embodiments of the present disclosure, the second layer includes a glass.

In some embodiments of the present disclosure, the first layer includes an organic Ag compound.

In some embodiments of the present disclosure, the step of forming the first layer is performed by using a first paste material including Ag in a first ratio, and the step of forming the second layer includes: installing a second paste material including Ag in a second ratio on the first layer to expose a portion of the first layer, and the second ratio is larger than the first ratio.

In some embodiments of the present disclosure, the first layer is mainly composed of an Ag—Pd alloy and the ratio of Ag is equal to or less than 80%, and the second layer is mainly composed of an Ag—Pd alloy and the ratio of Ag is equal to or more than 80%.

In some embodiments of the present disclosure, the step of performing the etching upon the first layer and the second layer includes: forming a plurality of strip-shaped portions arranged along a first direction, and in the step of forming the second layer, the first layer is exposed in a strip-shaped region extended in the first direction.

In some embodiments of the present disclosure, the plurality of strip-shaped portions is formed to intersect the strip-shaped region in a second direction perpendicular to the first direction.

In some embodiments of the present disclosure, the step of forming the first layer is performed by using a first paste material including Ag in a first ratio, and the step of forming the second layer includes: installing a second paste material including Ag in a second ratio on a region that is not covered by the first layer on the support member, wherein the second ratio is smaller than the first ratio.

In some embodiments of the present disclosure, the first layer is mainly composed of an Ag—Pd alloy and the ratio of Ag is equal to or more than 80%, and the second layer is mainly composed of an Ag—Pd alloy and the ratio of Ag is equal to or less than 80%.

A fine wiring pattern provided according to a second aspect of the present disclosure is formed by the manufacturing method of the fine wiring pattern provided according to the first aspect of the present disclosure.

A thermal print head provided according to a third aspect of the present disclosure includes the fine wiring pattern provided according to the second aspect of the present disclosure.

In some embodiments of the present disclosure, the thermal print head further includes a drive IC; and a wire for connecting the drive IC and the fine wiring pattern, wherein the wire is made of Au.

A thermal print head provided according to a fourth aspect of the present disclosure includes: a substrate; an electrode layer supported by the substrate, and having a plurality of portions separated each other; and a resistor layer having a portion configured to bridge the plurality of portions, wherein the electrode layer includes Ag as a main component.

In some embodiments of the present disclosure, the electrode layer has a first layer disposed on the substrate side, and a second layer laminated on the first layer, and the second layer includes Ag particles.

In some embodiments of the present disclosure, the second layer includes a glass.

In some embodiments of the present disclosure, the first layer is thinner than the second layer.

In some embodiments of the present disclosure, the first layer includes Pd.

In some embodiments of the present disclosure, the first layer and the second layer include Pd, and Pd content of the first layer is larger than Pd content of the second layer.

In some embodiments of the present disclosure, the first layer includes an organic Ag compound.

In some embodiments of the present disclosure, the thermal print head includes a glaze layer disposed between the substrate and the electrode layer.

In some embodiments of the present disclosure, the thermal print head includes a protection layer configured to cover the electrode layer and the resistor layer.

In some embodiments of the present disclosure, the substrate is made of $Al_2O_3$.

In some embodiments of the present disclosure, the electrode layer includes a common electrode having a connecting portion and a plurality of strip-shaped portions, and a plurality of individual electrodes, wherein the connecting portion extends in a primary scanning direction, the plurality of strip-shaped portions extend from the connecting portion in a second scanning direction, and each of the individual electrodes has a strip-shaped portion extended in the second scanning direction and located between adjoining strip-shaped portions, and wherein the resistor layer extends in the primary scanning direction to intersect with the plurality of strip-shaped portions of the common electrode and the strip-shaped portions of the plurality of individual electrodes.

In some embodiments of the present disclosure, the electrode layer includes a first thermal conduction layer and a second electrical conduction layer, wherein the first thermal conduction layer is directly contacted with the resistor layer and includes Ag in a first ratio, and wherein the second electrical conduction layer is directly contacted to the first thermal conduction layer and includes Ag in a second ratio, which is larger than the first ratio.

In some embodiments of the present disclosure, the first thermal conduction layer is mainly composed of an Ag—Pd alloy and the ratio of Ag is equal to or less than 80%, and the second thermal conduction layer is mainly composed of an Ag—Pd alloy and the ratio of Ag is equal to or more than 80%.

In some embodiments of the present disclosure, the second electrical conduction layer is separated from the resistor layer.

In some embodiments of the present disclosure, the second electrical conduction layer is formed on the first thermal conduction layer, the first thermal conduction layer has an exposed portion exposed from the second electrical conduction layer, and the resistor layer is installed to contact with the exposed portion.

In some embodiments of the present disclosure, the second electrical conduction layer includes a body portion, and a separating portion located on an opposite side of the body portion with the resistor layer being interposed therebetween.

In some embodiments of the present disclosure, the electrode layer has a plurality of strip-shaped portions arranged along the primary scanning direction, each of the stripe-shaped portions extends in the secondary scanning direction, the exposed portion is installed on each of the strip-shaped portions, and the separating portion is installed on a front end of each of the strip-shaped portions.

In some embodiments of the present disclosure, the second thermal conduction layer includes a first region formed on the second electrical conduction layer and a second region contacted with the resistor layer.

In some embodiments of the present disclosure, the second region of the first thermal conduction layer does not overlap with the second electrical conduction layer.

Other features and advantages of the present disclosure will become more apparent from the detailed description made in conjunction with the accompanying drawings.

BRIEF DESCRIPTION OF THE DRAWINGS

FIG. 6 is an enlarged cross-sectional view showing the thermal print head according to the first embodiment of the present disclosure.

FIG. 7 is a cross-sectional view showing a substrate used in a manufacturing method of the thermal print head according to the first embodiment of the present disclosure.

DETAILED DESCRIPTION

Figure 1:
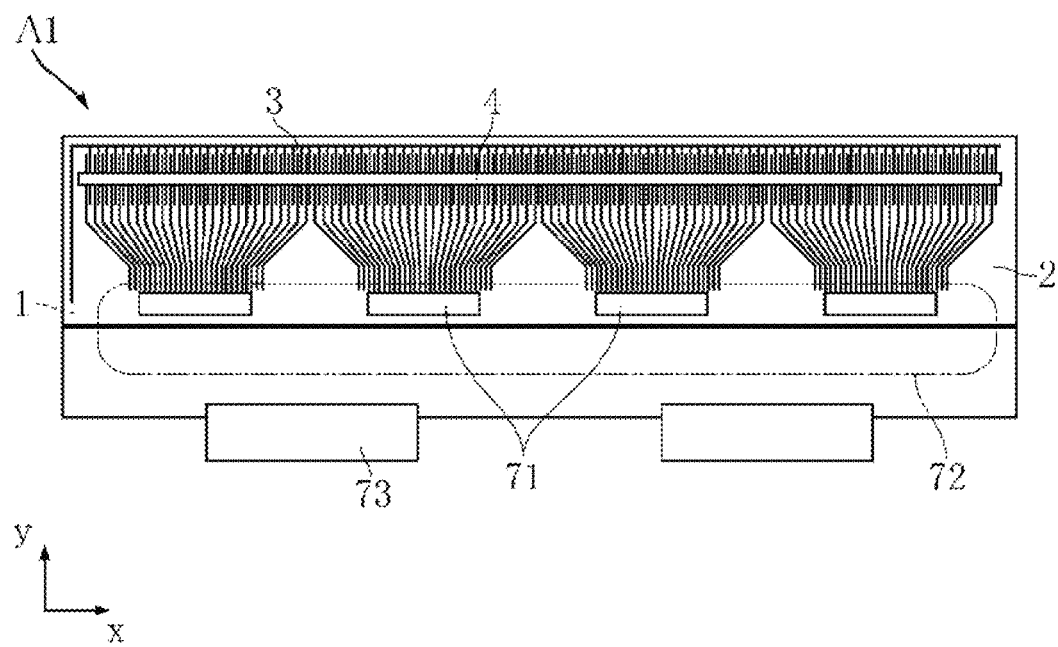
FIG. 1 is a top view showing a thermal print head according to a first embodiment of the present disclosure.

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Some embodiments of the present disclosure will now be described in detail with reference to the drawings.

FIGS. 1 to 6 show a thermal print head according to a first embodiment of the present disclosure. The thermal print head A1 of the present embodiment includes a substrate 1, a glaze layer 2, an electrode layer 3, a resistor layer 4, a protection layer 5 and a drive IC 71. The thermal print head A1 is assembled into a printer for printing thermal paper, which may be a bar-code paper or receipts. Further, for the sake of understanding, the protection layer 5 is omitted in FIGS. 1 and 2. In the figures, a primary scanning direction is an x direction, a secondary scanning direction is a y direction, and a thickness direction of the substrate 1 is a z direction.

The substrate 1 is made of, for example, a ceramic such as $Al_2O_3$. The thickness of the substrate 1 is, for example, about 0.6~1.0 mm. As shown in FIG. 1, the substrate 1 is formed into an elongated rectangular shape extending in the primary scanning direction x. In addition, the substrate 1 may have a configuration including a wiring substrate in which a base layer made of, for example, a glass epoxy resin and a wiring layer made of, for example, Cu are laminated one above another. Further, a heat radiating plate made of metal such as Al, may be installed on the lower surface of the substrate 1. In the configuration having the wiring substrate, the substrate 1 and the wiring substrate are closely disposed on the heat radiating plate, and a wiring of the substrate 1 (or, IC connected to the wiring) and a wiring of the wiring substrate (or, IC connected to the wiring) are connected by, for example, a wire bonding. Further, a connector 73 shown in FIG. 1 may be installed on the wiring substrate.

The glaze layer 2 is formed on the substrate 1, and is made of a glass material such as an amorphous glass. A softening point of the glaze layer 2 is, for example, 800~850 degrees C. The formation of the glaze layer 2 is performed by thick-film printing a glass paste and then sintering the thick-film printed glass paste. The glaze layer 2 may have a configuration including a protruding portion, which is extended in the x direction and is bulged in the z direction.

Figure 3:
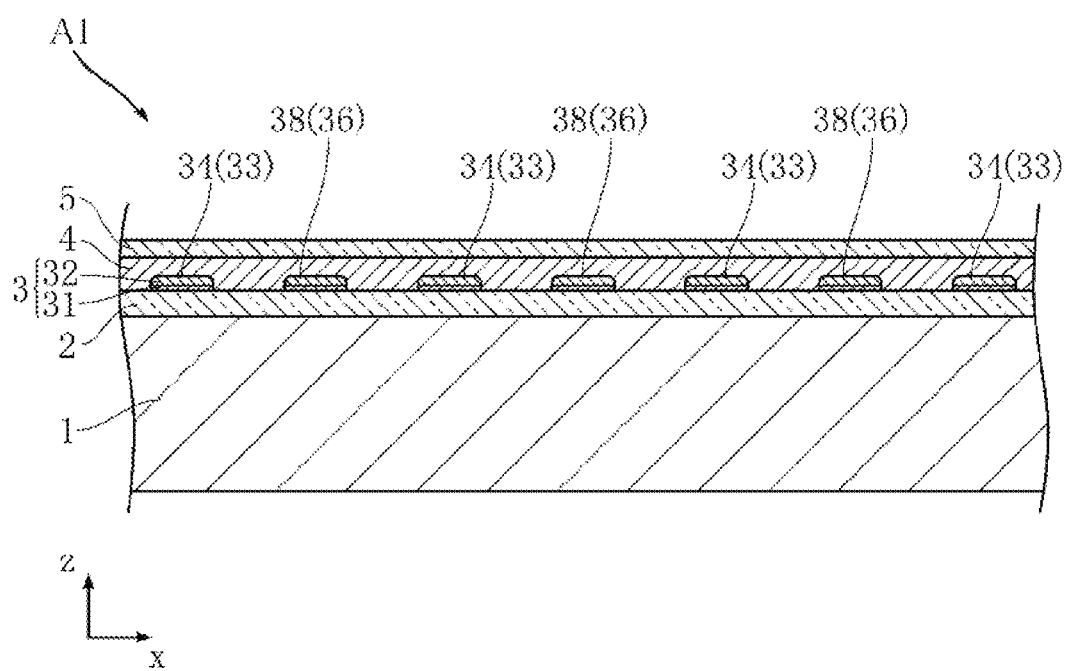
FIG. 3 is a cross-sectional view along line III-III in FIG. 2.
Figure 4:
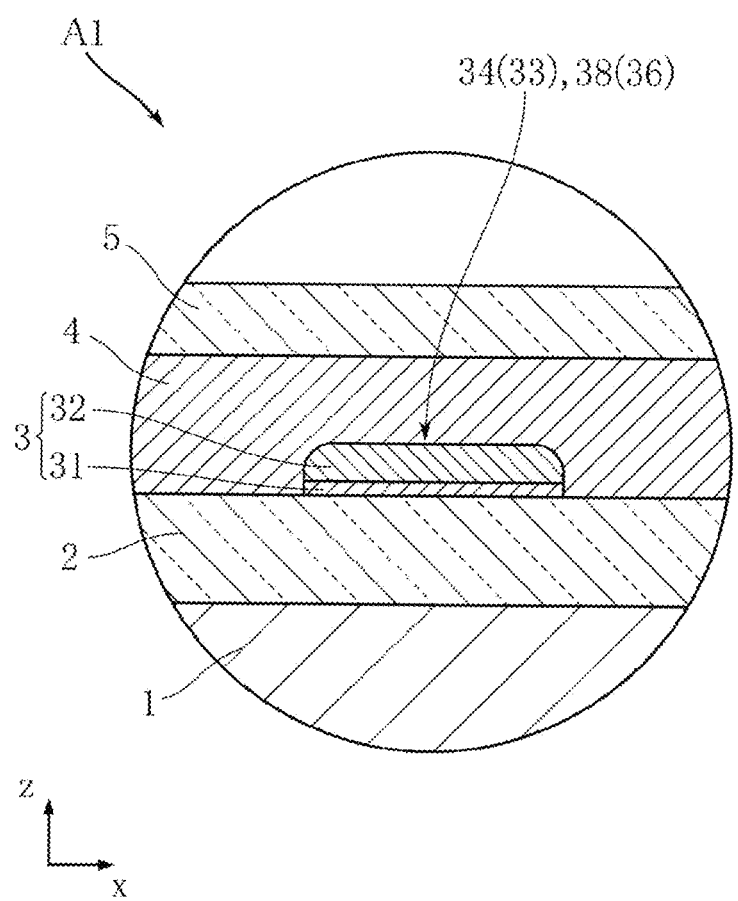
FIG. 4 is an enlarged cross-sectional view showing the thermal print head according to the first embodiment of the present disclosure.

The electrode layer 3 is provided to define a route for applying an electric current to the resistor 4. The electrode layer 3 is made of a conductor mainly composed of Ag. Further, in the present embodiment, the electrode layer 3 includes a first layer 31 and a second layer 32 as shown in FIGS. 3 and 4. The electrode layer 3 is an example of the fine wiring pattern according to the present disclosure.

The first layer 3 is formed on the glaze layer 2. The formation of the first layer 3 is performed by printing and sintering a paste including, for example, organic Ag compounds. The first layer 31 includes the organic Ag compounds mainly composed of Ag. Also, the first layer 31 includes Pd. The content of Pd is more than 0.1 wt % and is less than 30 wt %. Further, the first layer 31 does not include a glass. The thickness of the first layer 31 is, for example, 0.3 μm~1.0 μm.

The second layer 32 is formed on the first layer 31. The formation of the second layer 32 is performed by printing and sintering, for example, an Ag paste for a thick-film print. The second layer 32 includes an Ag powder mainly composed of Ag. The Ag powder may have a spherical shape or a flake shape. An average particle size of the Ag powder is, for example, 0.1~10 μm. Also, the second layer 32 includes a glass of, for example, 0.5~10 wt %. The glass is, for example, a borosilicate glass or a borosilicate lead glass. Also, the second layer 32 includes Pd. For example, the content of Pd is equal to or more than 0.1 wt % and is less than 30 wt %. The Pd content of the second layer 32 is smaller than the Pd content of the first layer 31. The thickness of the second layer 32 is, for example, 2~10 μm. A surface of the second layer 32 has relatively rough texture as the Ag powder is distributed.

Figure 2:
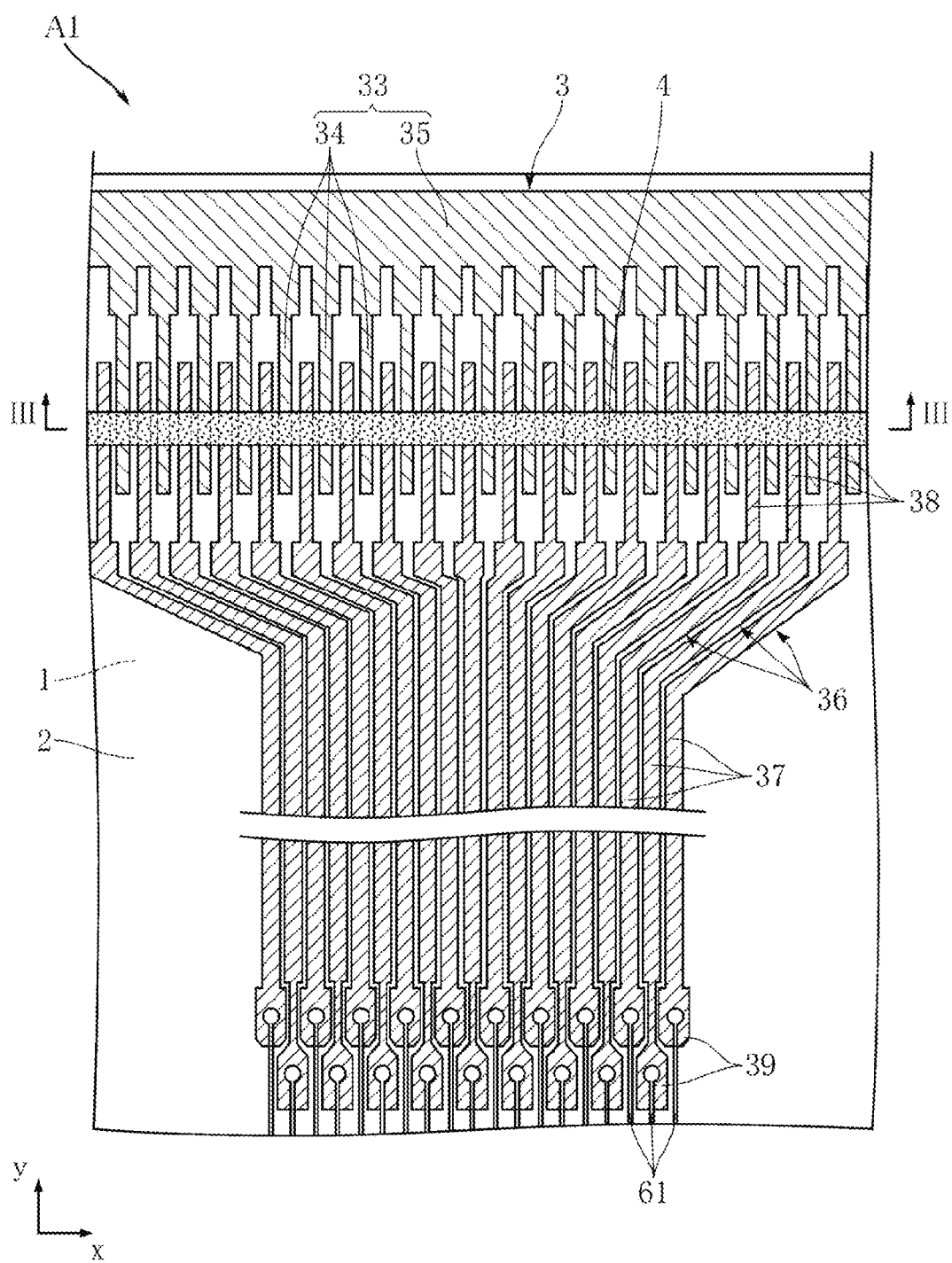
FIG. 2 is an enlarged top view showing the thermal print head according to the first embodiment of the present disclosure.

As shown in FIG. 2, the electrode layer 3 includes a common electrode 33 and a plurality of individual electrodes 36. The common electrode 33 includes a plurality of strip-shaped portions 34 and a connecting portion 35. The connecting portion 35 is disposed near one end of the substrate 1 in the secondary scanning direction y. The connecting portion 35 extends in the primary scanning direction x and has a strip-like shape. Each of the strip-shaped portions 34 extends from the connecting portion 35 in the y direction, and is arranged at a regular pitch along the x direction.

The plurality of individual electrodes 36 is provided for partially applying the current to the resistor layer 4. Each of the individual electrodes 36 has an electrical polarity, which is opposite to the common electrode 33. The individual electrodes 36 extend from the resistor layer 4 toward the drive IC 71. The individual electrodes 36 are disposed along the primary scanning direction x. Each of the individual electrodes 36 includes a strip-shaped portion 38, a connecting portion 37 and a bonding portion 39. Each of the strip-shaped portions 38 extends in the secondary scanning direction y and is located between the adjoining two strip-shaped portions 34 of the common electrode 33. The width of the strip-shaped portion 38 of the individual electrodes 36 and the width of the strip-shaped portion 34 of the common electrode 33 are equal to or less than 25 μm. The space between the strip-shaped portion 38 of the individual electrode 36 and the adjacent strip-shaped portion 34 of the common electrode 33 is equal to or less than 40 μm. The connecting portion 37 extends from the strip-shaped portion 38 toward the drive IC 71. The connecting portion 37 has a first portion extended in the y direction and a second portion inclined with respect to the y direction. The width of the most portion of the connection portion 37 is equal to or less than 20 μm. The space between the adjoining connecting portions 37 is equal to or less than 20 μm. The bonding portion 39 is formed on one end of the individual electrodes 36 in the y direction. The bonding portion 39 is bonded with a wire 61 for connecting the individual electrodes 36 and the drive IC 71. The bonding portion 39 of the adjoining individual electrodes 36 is staggered in the y direction. Thus, while the width of the bonding portion 39 is larger than the most portion of the connecting portion 37, it is possible to avoid the interference with each other. A portion interposed between the adjoining bonding portions 39 of the connecting portion 37 has the smallest width in the individual electrodes 36. The width of the portion is equal to or less than 10 μm. Also, the space between the connecting portion 37 and the adjoining bonding portion 39 is equal to or less than 10 μm. Thus, the common electrode 33 and the individual electrodes 36 become the fine pattern having a relatively small line width and wiring space.

Figure 5:
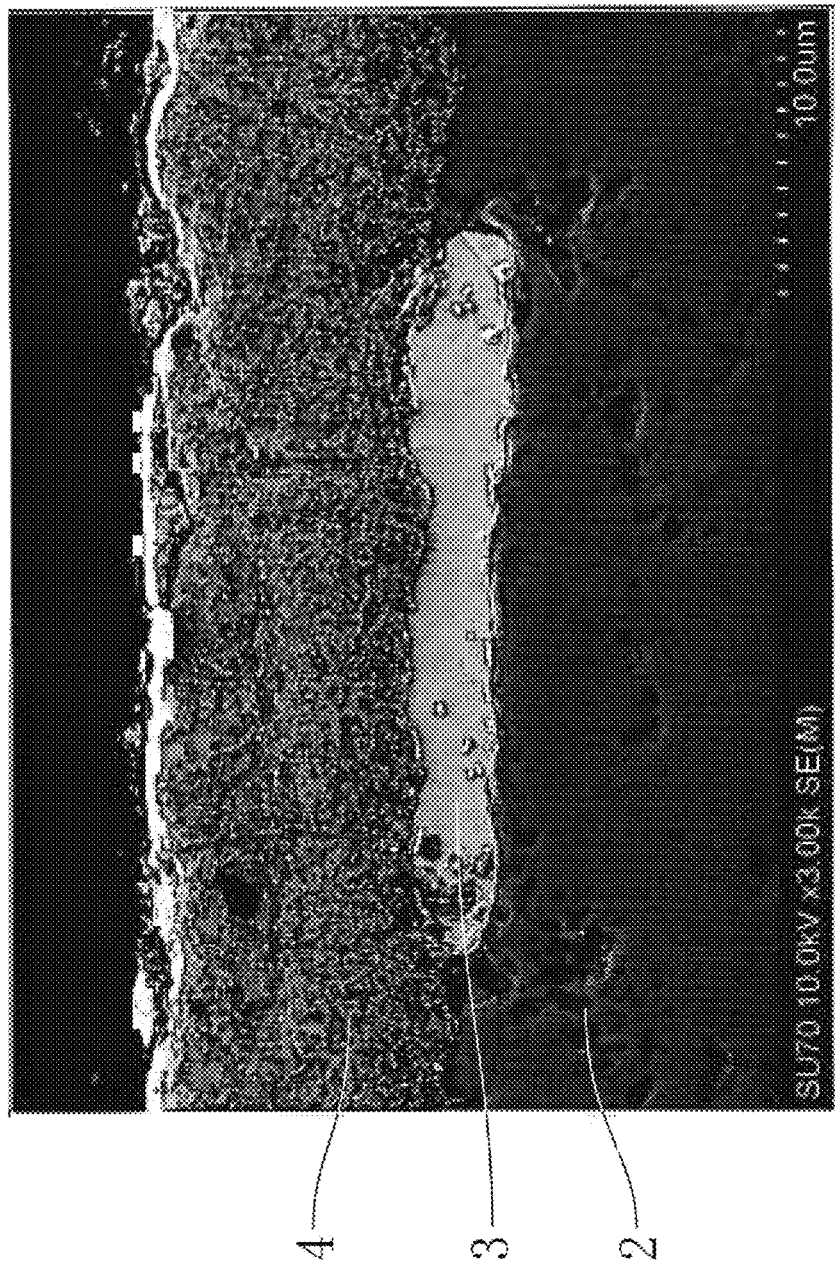
FIG. 5 is an enlarged cross-sectional photograph showing the thermal print head according to the first embodiment of the present disclosure.

FIG. 5 is a cross-sectional photograph of a portion of the thermal print head A1 corresponding to FIG. 4. As shown in FIGS. 4 and 5, an upper surface of the electrode layer 3 of the strip-shaped portion 34 or the strip-shaped portion 38 of the individual electrode 36 has a gently-sloping curved surface and does not have a sharp shape.

The resistor layer 4 is made of a material having a resistivity larger than that of the electrode layer 3. Such material may be, for example, a ruthenium oxide and the like. The resistor layer 4 is formed in the shape of a strip extending in the x direction. The resistor layer 4 intersects with the strip-shaped portions 34 of the common electrode 33 and the strip-shaped portions 38 of the individual electrodes 36. The portions of the resistor layer 4 interposed between each of the strip-shaped portions 34 and each of the strip-shaped portions 38 serve as heating portions. The heating portions are heated when the electric current is partially applied by the electrode layer 3. Printing dots are formed by heating the heating portions.

The protection layer 5 is provided to protect the electrode layer 3 and the resistor layer 5. The protection layer 5 is made of, for example, an amorphous material glass. However, the protection layer 5 exposes the region including the bonding portions 39 of the individual electrodes 36.

The drive IC 71 serves to selectively heat some of the resistor layer 4 by selectively applying the electric current to the plurality of individual electrodes 36. The drive IC 71 includes a plurality of pads. FIG. 6 is an enlarged cross-sectional view in the y-z plane intersecting the drive IC 71. As shown in FIGS. 2 and 6, the pads of the drive IC 71 and the individual electrodes 36 are connected through a plurality of wires 61. Each of the wires 61 are bonded to each of the pads and each of individual electrodes 36. The wires 61 are made of Au. As shown in FIGS. 1 and 6, the drive IC 71 is covered with an encapsulation resin 72. The encapsulation resin 72 is, for example, a black soft resin. Also, the drive IC 71 and the connector 73 are connected by a signal line (not shown).

Next, an example of a manufacturing method of the thermal print head A1 will be described with reference to FIGS. 7 to 10.

First, the substrate 1 made of, for example, $Al_2O_3$ is prepared, as shown in FIG. 7. Next, the glaze layer 2 is formed by thick-film printing the glass paste on the substrate 1 and then sintering the printed glass paste.

Figure 8:
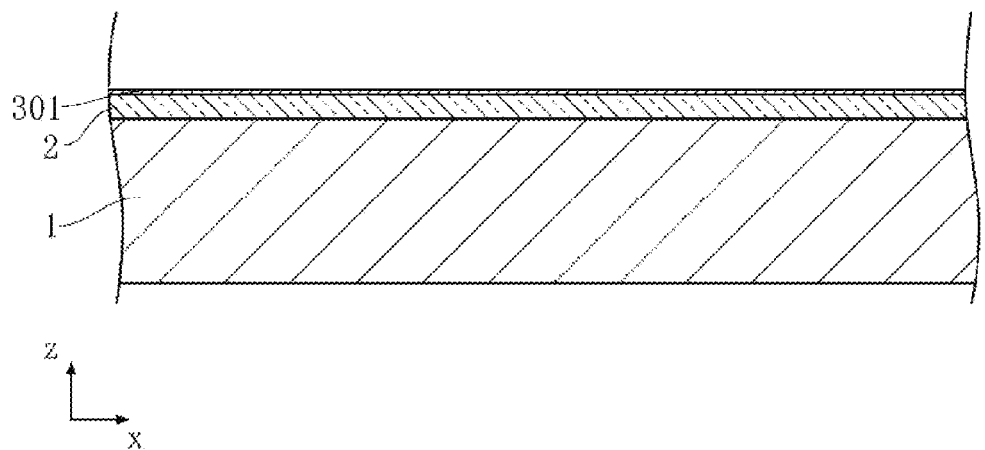
FIG. 8 is a cross-sectional view showing a state where a first layer of an Ag paste layer is formed in the manufacturing method of the thermal print head according to the first embodiment of the present disclosure.

Next, the first layer 301 is formed, as shown in FIG. 8. The first layer 301 is formed by thick-film printing a paste including an organic Ag compound. The paste including the organic Ag compound includes the organic Ag compound, Pd and a resin. The resin content is, for example, 60~80 wt %.

Figure 9:
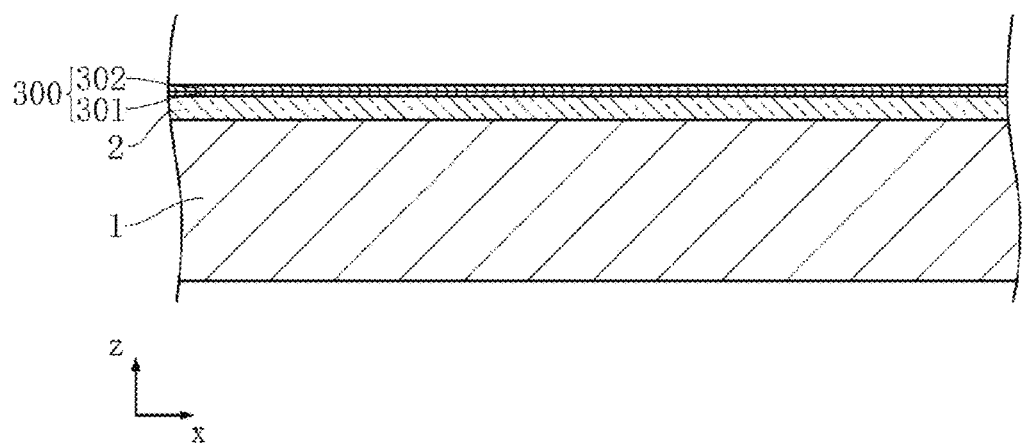
FIG. 9 is a cross-sectional view showing a state where a second layer of the Ag paste layer is formed in the manufacturing method of the thermal print head according to the first embodiment of the present disclosure.

Next, the second layer 302 is formed, as shown in FIG. 9. The second layer 302 is formed by thick-film printing an Ag paste for the thick-film print. The Ag paste for the thick-film print includes Ag particles, glass fits, Pd and a resin. The resin content is, for example, 20~30 wt %. The Ag paste layer 300 includes the first layer 301 and the second layer 302.

Figure 10:
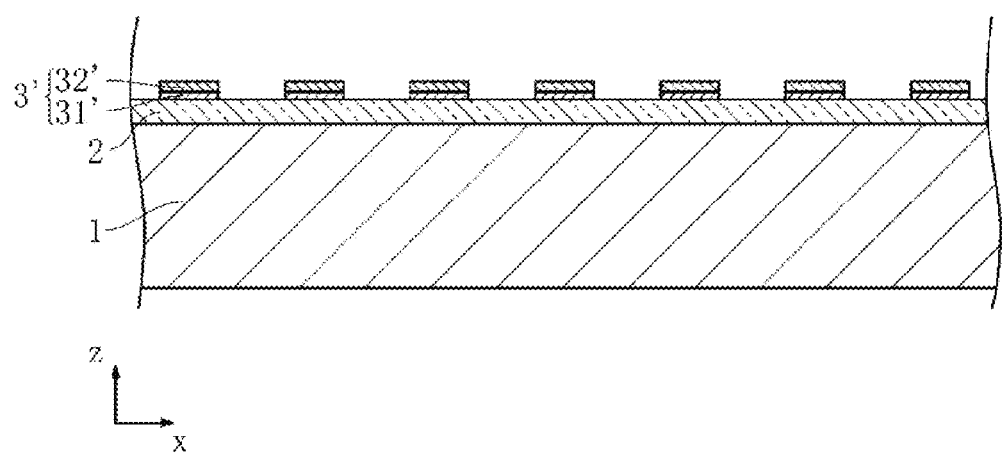
FIG. 10 is a cross-sectional view showing a state where an electric conduction layer is formed in the manufacturing method of the thermal print head according to the first embodiment of the present disclosure.
Figure 11:
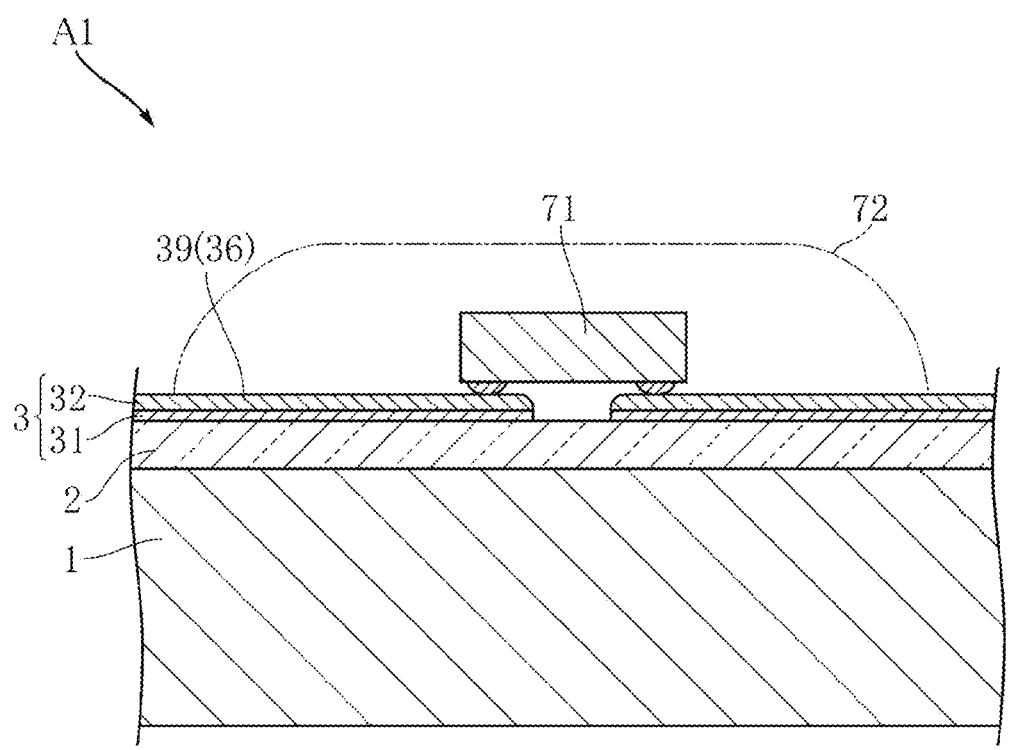
FIG. 11 is an enlarged cross-sectional view showing another embodiment of the thermal print head according to the first embodiment of the present disclosure.

Next, the conductor layer mainly composed of Ag is formed by sintering the Ag paste layer 300. Further, a conductor layer 3' shown in FIG. 10 is formed by a patterning process, for example, by etching the conductor layer. The upper surface of the conductor layer 3' has a sharp shape by the etching. The conductor layer 3' includes a first layer 31' and a second layer 32'. The first layer 31' includes an organic Ag mainly composed of Ag, and the second layer 32' includes the Ag particles mainly composed of Ag. The resin, which is included to the first layer 301 and the second layer 302, is evanesced by the above sintering process. Because the first layer 301 includes more resin than the second layer 302, the first layer 31' has the thickness thinner than the second layer 32'.

After the above processes, the resistor layer 4 and the protection layer 5 are formed, and a mounting process of the drive IC 712 and a bonding process of the wires 61 are performed, so that the thermal print head A1 is obtained. Further, in the sintering process for forming the resistor layer 4 and the protection layer 5, the shape of the upper surface of the conductor layer 3' is changed from the sharp shape to a curved shape. As undergoing the shape change, the electrode layer 3 shown in FIGS. 3 and 4 is formed.

Next, the actions of the thermal print head A1 will be described.

In the present embodiment, the electrode layer 3 is made of a material mainly composed of Ag. Therefore, for example, it is possible to reduce the manufacturing cost as compared with the configuration in which the electrode layer 3 is made of a material mainly composed of Ag.

As the second layer 32 includes the Ag particles, the surface of the second layer 32 has relatively rough texture. Therefore, the contact area of the second layer 32 and the resistor layer 4 is increased, and the second layer 32 and the resistor layer 4 are easily attached. Thus, the contact resistance of the electrode layer 3 and the resistor layer 4 can be reduced. Further, the wires 61 for connecting the individual layer 36 and the drive IC 71 can be reliably bonded by the individual electrodes 36. The attachment of the wires 61 made of Au and Ag are difficult, and the bonding strength is reduced. However, an enough bonding strength is obtained by roughly forming the surface of the boding portion 39.

As the second layer 32 includes the glass, the Ag particles supported by the glass may easily distribute in a region near the surface of the second layer 32. It is suitable that the surface of the second layer 32 has the rough texture.

The first layer 31 is thinner than the second layer 32, and includes the Ag particles as well the organic Ag compound. This is similar to the first layer 31 of the conductor layer 3' shown in FIG. 10. It is suitable that the first layer 31' is finished with a more defined shape by the patterning process using the etching and the like. According to the present embodiment, the etching is performed for the conductor layer obtained by sintering the Ag paste layer 300 in which the first layer 301 and the second layer 302 are laminated on above another. In this case, the patterning can be accurately performed upon the whole conductor layer 3' as the relatively thin first layer 31' including the organic Ag compound is formed. When the fine wiring pattern has the wiring width of 25 µm or smaller and the wiring space of 40 µm or smaller in the strip-shaped portions 38 of the individual electrodes 36 or the strip-shaped portion 34, and has the wiring width of 10 µm or smaller, and the wiring space of 10 µm or smaller in the portion interposed between the adjoining bonding portions 39 of the connecting portion 37, a precision of the patterning is not obtained, if the Ag paste is simply used. That is, there is a problem that the wirings connected with each other may be shorted in the etching, e.g., the wirings are disconnected by over-etching. In the present disclosure, although the fine wiring pattern is formed by using Ag, the patterning can be accurately performed. According to the present embodiment, the first layer 31' includes the organic Ag compound. However, the first layer 31' may have other configuration including other material. For example, the paste including $Ta_2O_3$ may be used.

The first layer 31 includes Pd, and the content of Pd in the first layer 31 is larger than the content of Pd in the second layer 32. In this case, it can be avoided that a resistance of the first layer 31 is wrongfully increased while the first layer 31 is thicker than the second layer 32. As a sheet resistance of the first layer 31 is reduced, a low resistivity of the whole electrode layer 3 can be promoted. As the first layer 31 includes the organic Ag compound, the first layer 31 can be made thinner and the sheet resistance can be made smaller. Further, as the first layer 31 does not include the glass, it promotes that the sheet resistance is made smaller.

As described in the above, it is obtained that the connection with the resistor layer 4 is secured as the second layer 32 is formed to have a relatively rough surface texture. Although the material used to manufacture the second layer 32 is the Ag paste for the thick-film printing, a material beside the above materials may be used to manufacture the second layer 32. For example, the material may include a photosensitive Ag paste.

A case where the photosensitive Ag paste is used as a material for manufacturing the second layer 32 will be described. The paste includes an Ag powder having an average particle size of, for example, 0.1~10 µm. The Ag powder has a spherical shape or a flake shape. Further, the resin content is about 20~30 wt %. Metal components including Ag may be remained in the second layer 32 by exposing and then sintering the photosensitive Ag paste. Also, the second layer 32 may be formed by exposing and hardening the photosensitive Ag paste. In the second layer 32 formed by using the photosensitive Ag paste, the content of the glass is, for example, 0.5~105, the thickness of the second layer 32 is, for example, 2~10 µm, and the content of Pd is more than 0.1 wt % and less than 30 wt %.

Further, an Ag nano paste may be used as a material for manufacturing the second layer 32. The Ag nano paste includes Ag particles having the average particle size of, for example, 0.0~10.5 µm. Also, the Ag nano paste can be sintered at a lower temperature as compared with the Ag paste for the thick-film printing. The Ag nano paste has the resin content of, for example, 20~30 wt %. In the second layer 32 formed by using the Ag nano paste, the content of the glass is, for example, 0.5~10%, the thickness of the second layer 32 is, for example, 0.5~10 µm, the content of Pd is 0.1~30 wt %. When using the Ag nano paste, the surface texture of the second layer 32 is made smoother than the case of using the Ag paste for the thick-film printing or the photosensitive Ag paste.

Further, although the drive IC 71 and the electrode layer 3 are connected by the wire 61 is described in the present embodiment, a flip-chip connection between the drive IC 71 and the electrode layer 3 may be performed by using the drive IC 71 having a solder bump. In this case, because the wires 61 made of Au are not used, the surface of the bonding portion 39 requires less roughness. Further, although all of the individual electrodes 36 and the common electrode 33 are formed by printing two layers according to this embodiment, some portions of the individual electrodes 36 and the common electrode 33 may be formed to have a two-layered structure.

FIGS. 12 to 26 show another embodiment of the present disclosure. Also, in these figures used in describing the manufacturing method, the same components as described above will be designated by like reference symbols.

FIGS. 12 to 16 show a thermal print head A2 according to a second embodiment of the present disclosure. The configuration of the electrode layer 3' in the thermal print head A2 of the present embodiment is different to the configuration of the electrode layer 3 in the thermal print head A1 while other configurations in the thermal print head A2 of the present embodiment are similar to other configurations in the thermal print head A1. Further, for the sake of understanding, the protection layer 5 is omitted in FIG. 12. In these figures, a primary scanning direction is an x direction, a secondary scanning direction is a y direction, and the thickness direction of the substrate 1 is a z direction.

Figure 12:
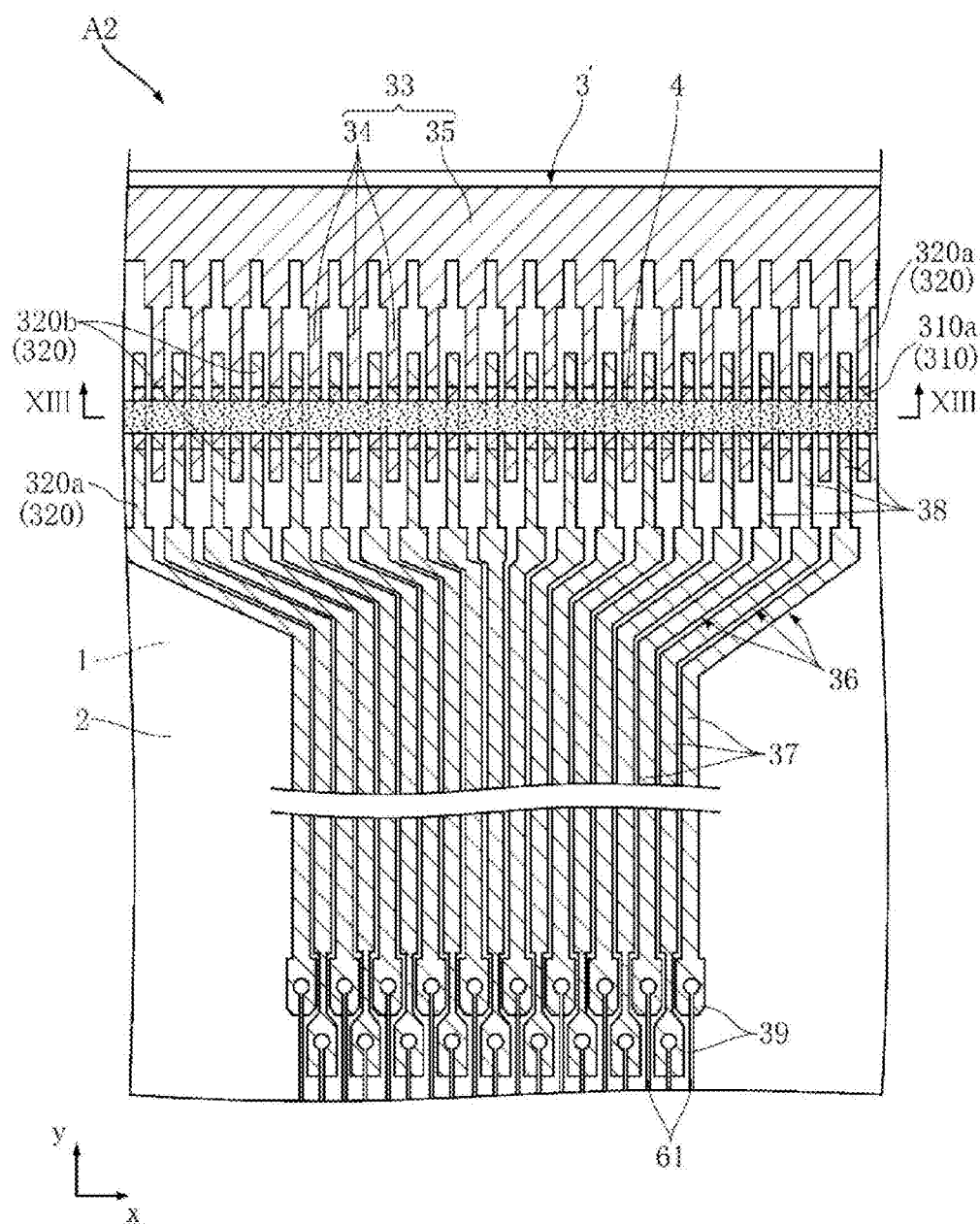
FIG. 12 is an enlarged top-view showing a thermal print head according to a second embodiment of the present disclosure.
Figure 13:
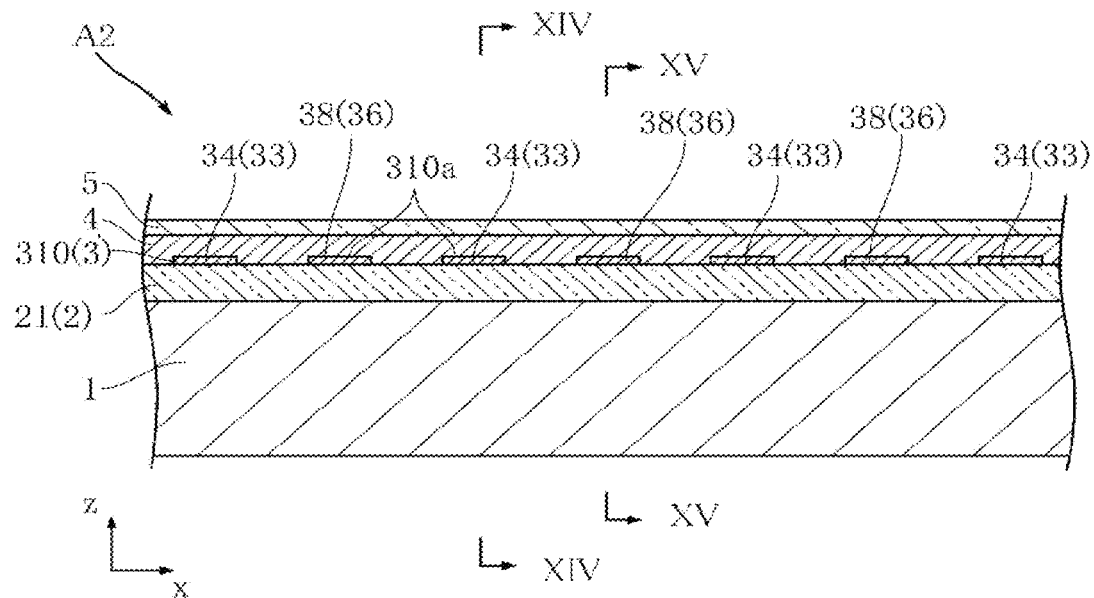
FIG. 13 is a cross-sectional view along line XIII-XIII in FIG. 12.

As shown in FIG. 12, the shape of the electrode layer 3' of the present embodiment is substantially similar to that of the electrode layer 3 in the thermal print head A1 when seen from a plane view. That is, the electrode layer 3' has the common electrode 33 and the plurality of individual electrodes 36 for the thermal print head A1. The common electrode 33 includes a plurality of strip-shaped portions 34 and a connecting portion 35. The plurality of individual electrodes 36 are arranged along the primary scanning direction x. Each of the individual electrodes 36 has a strip-shaped portion 38, a connecting portion 37 and a bonding portion 39.

Figure 14:
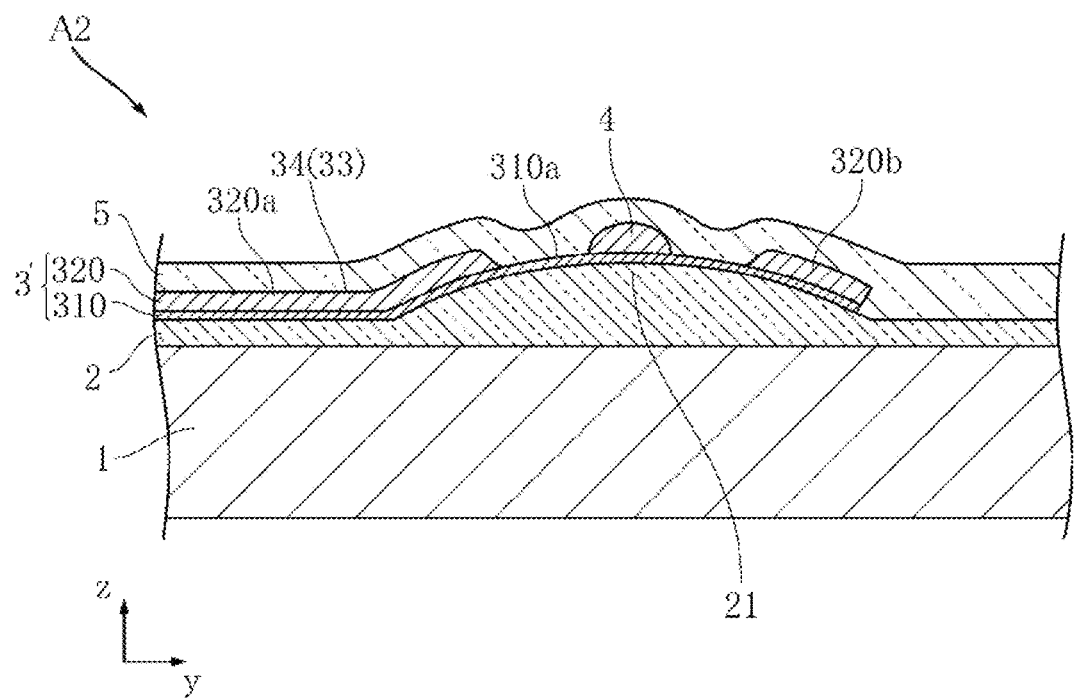
FIG. 14 is a diagram showing the main parts of the cross section along line XIV-XIV in FIG. 13.
Figure 15:
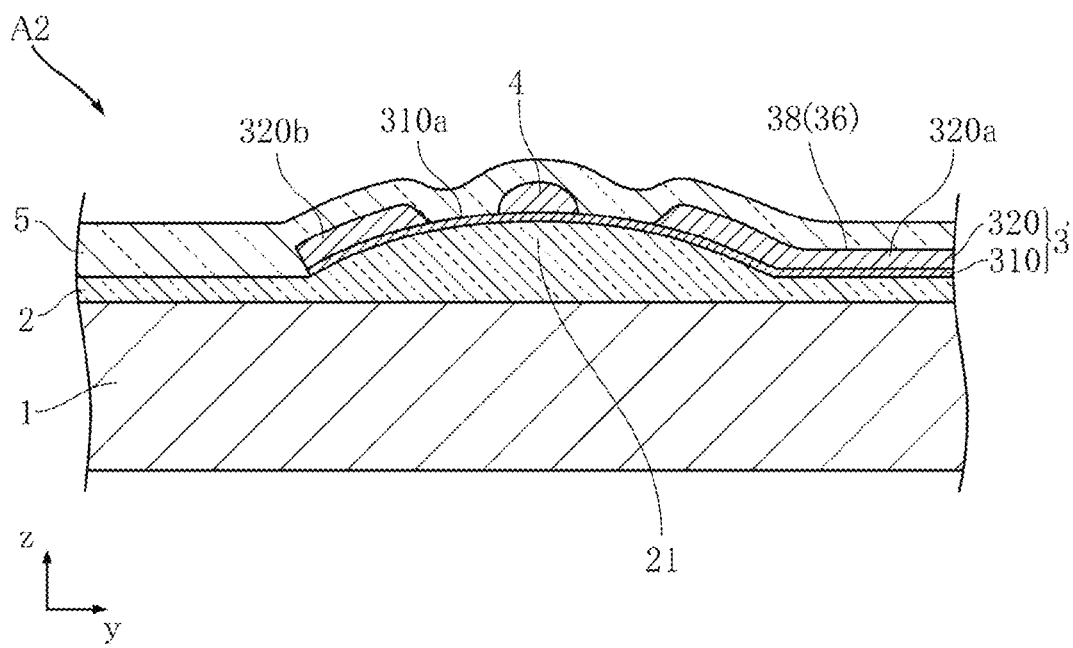
FIG. 15 is a diagram showing the main parts of the cross section along line XV-XV in FIG. 13.

The electrode layer 3' of the present embodiment includes a low thermal conduction layer 310 directly connected with the resistor layer 4, and a high electrical conduction layer 320 directly connected with the low thermal conduction layer 310. The most of the electrode layer 3' has a structure in which the high electrical conduction layer 320 is laminated on the low thermal conduction layer 310. As shown in FIGS. 14 and 15, a protruding portion 21 is installed on the glaze layer 2, and some portions of the strip-shaped portions 34 and 38 extend to the protruding portion 21. The high electrical conduction layer 320 is formed on the low thermal conduction layer 310, and the low thermal conduction layer 310 includes an exposed portion 310a exposited from the high electrical conduction layer 320. The exposed portion 310a is provided near an apex of the protruding portion 21. The resistor layer 4 is installed to contact with the exposed portion 310a.

As shown in FIG. 12, the high electrical conduction layer 320 includes main body portion 320a and a separating portion 320b, which is located on an opposite side of the body portion 320a while the resistor layer 4 is interposed therebetween. Specifically, the body portion 320a is installed on a region extended from a root of each of the strip-shaped portions 34 to one side of the resistor layer 4 in the direction y, the connecting portion 35, a region extended from a root of the strip-shaped portion 38 to the other side of the resistor layer 5, the connecting portion 37 and the bonding portion 39. Meanwhile, the separating portion 320b is installed on a region extended from a front end of each of the strip-shaped portions 34 to the other side of the resistor layer 4, and a region extended from a front end of each of the strip-shaped portions 38 to the one side of the resistor layer 4. With this configuration, the high electrical conduction layer 320 is separated from the resistor layer 4.

The strip-shaped portions 34 have a function for electrically connecting the resistor layer 4 and the connecting portion 35. In the strip-shaped portion 34, the separating portion 320b is located on an opposite side of the connecting portion 35 while the resistor layer 4 is interposed therebetween, and does not perform any function. Similarly, in the strip-shaped portion 38, the separating portion 320b is located on an opposite side of the connecting portion 37 and the bonding portion 39 while the resistor layer 4 is interposed therebetween, and does not perform any function. The separating portion 320 is a portion formed as a result of the following manufacturing method.

Figure 16:
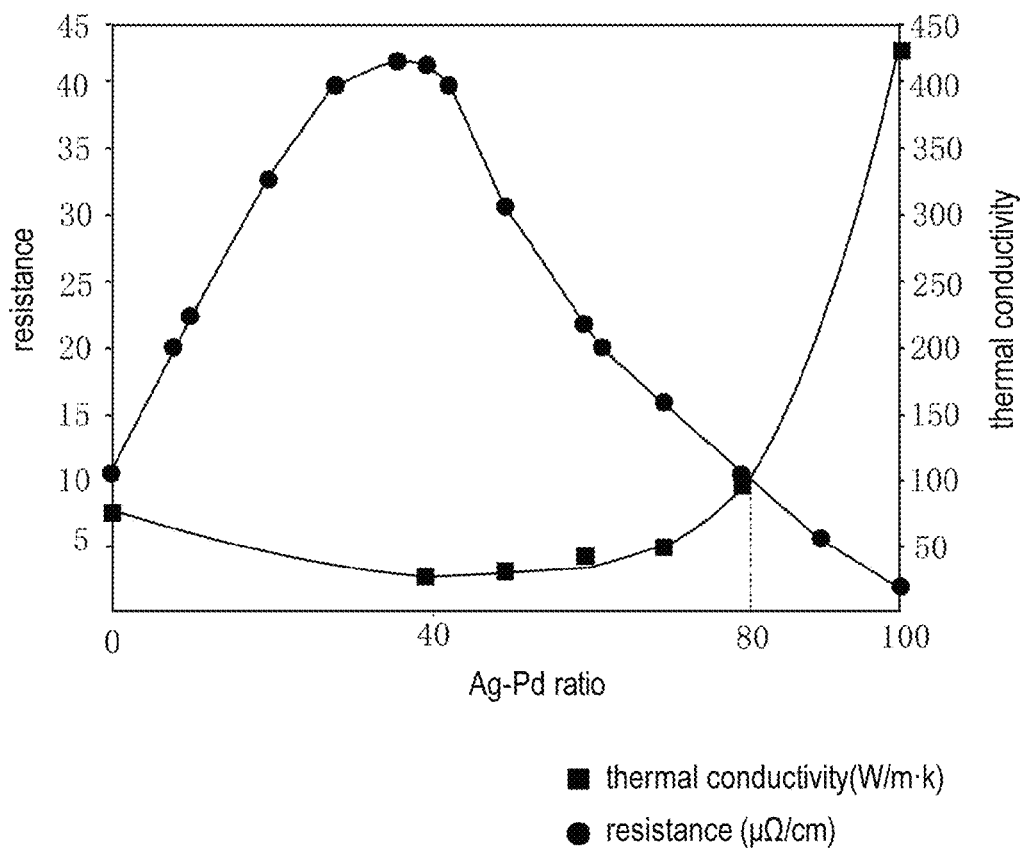
FIG. 16 is a diagram illustrating a material of an electrode layer in the thermal print head shown in FIG. 12.

The low thermal conduction layer 310 and the high electrical conduction layer 320 are mainly composed of, for example, an alloy of Ag and Pd. FIG. 16 is a diagram illustrating a composition of an Ag—Pd alloy which the low thermal conduction layer 310 and the high electrical conduction layer 320 are made of and shows a relationship between a ratio of Ag in the Ag—Pd alloy and a thermal conductivity, and between the ratio of Ag and an electrical resistance. As shown in FIG. 16, the thermal conductivity of the Ag—Pd alloy becomes a minimum when the ratio of Ag is about 40%, and increases thereafter as the ratio of Ag increases. The thermal conductivity is about 100 w/m·k when the ratio of Ag is 80%, and the ratio of Ag increases thereafter as the ratio of Ag increases. Meanwhile, the resistance of the Ag—Pd alloy becomes a maximum when the ratio of Ag is about 40%, and the ratio of Ag decreases thereafter as the ratio of Ag increases. For example, when the ratio of Ag is 80%, the resistance of the Ag—Pd alloy is about 10 μΩ·cm. From the above properties, the materials of the low thermal conduction layer 310 and the high electrical conduction layer 320 are determined as the following.

The low thermal conduction layer 310 is mainly composed of the Ag—Pd alloy that the ratio of Ag is equal to or less than 80%. Meanwhile, the high electrical conduction layer 320 is mainly composed of the Ag—Pd alloy that the ratio of the Ag is equal to or more than 80%. According to the above configuration, the low thermal conduction layer 310 has properties that the thermal conductivity is equal to or less than 100 w/m·k, and the heat is relatively difficult to be transmitted. Further, the high electrical conduction layer 320 has properties that the electrical resistance is equal to or less than 10 μΩ·cm, and the electrical conductivity is relatively excellent.

The process of forming the electrode layer 3 according to the present embodiment can be performed in accordance with basically the same process as the process of forming the electrode layer 3 in the thermal print head A1. The difference between the process of forming the electrode layer 3 in the thermal print head A2 and the process of forming the electrode layer 3 in the thermal print head A1 will be described below with reference to FIGS. 17 to 22.

The low thermal conduction layer 310 is formed by printing and sintering, for example, a first paste material 311 including Ag in a first ratio. The first paste material 311 is a mixture including, for example, an organic Ag compound and an organic Pd compound. When sintering the first paste material 311, Ag and Pd included in the organic Ag compound and the organic Pd compound are alloyed. The first ratio is determined so that the ratio of Ag after alloying is equal to or less than 80%.

The high electrical conduction layer 320 is formed by printing and sintering a second paste material 321 including Ag in a second ratio, which is larger than the first ratio. The second paste material 321 is a mixture including, for example, an organic Ag compound and an organic Pd compound. When sintering the second paste material 321, Ag and Pd included in the organic Ag compound and the organic Pd compound are alloyed. The second ratio is determined so that the ratio of Ag after alloying is equal to or more than 80%.

Figure 17:
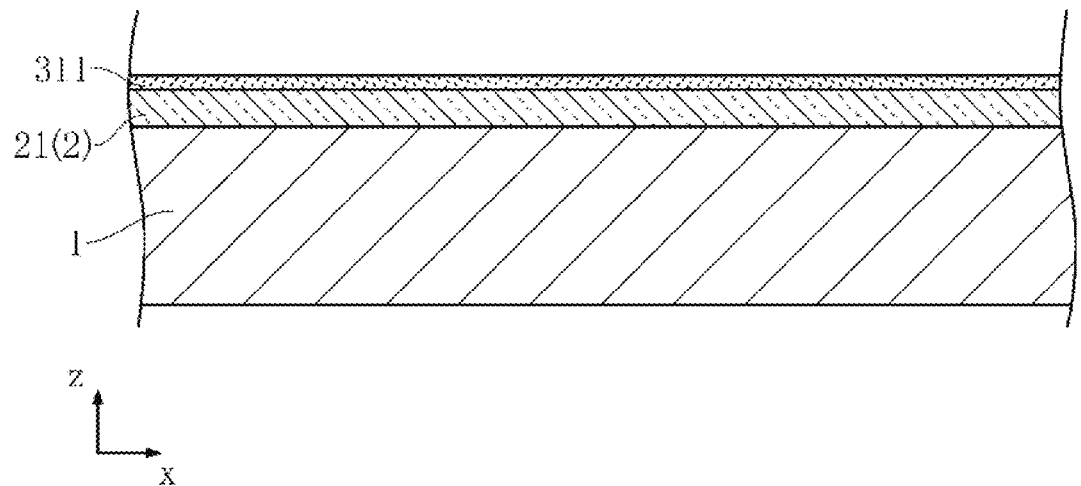
FIG. 17 is a diagram showing an example of the manufacturing method of the thermal print head shown in FIG. 12.
Figure 18:
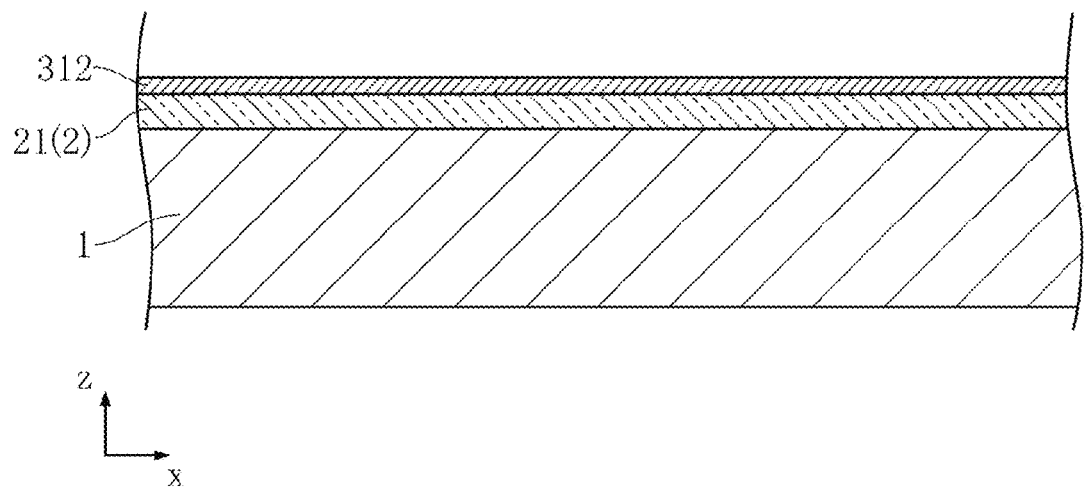
FIG. 18 is a diagram showing a step subsequent to the step shown in FIG. 17.

Although the first layer 301 and the second layer 302 are simultaneously sintered in the process of manufacturing the thermal print head A1, the first paste material 311 and the second paste material 320 are individually sintered in the present embodiment. Specifically, as shown in FIG. 17, a process of sintering the first paste material 311 is performed after performing the process of printing the first paste material 311 on the glaze layer 2. As a result, as shown in FIG. 18, the first paste material 311 becomes the first layer 312. The first layer 312 is mainly composed of the Ag—Pd alloy that the ratio of Ag is equal to or less than 80%.

Figure 19:
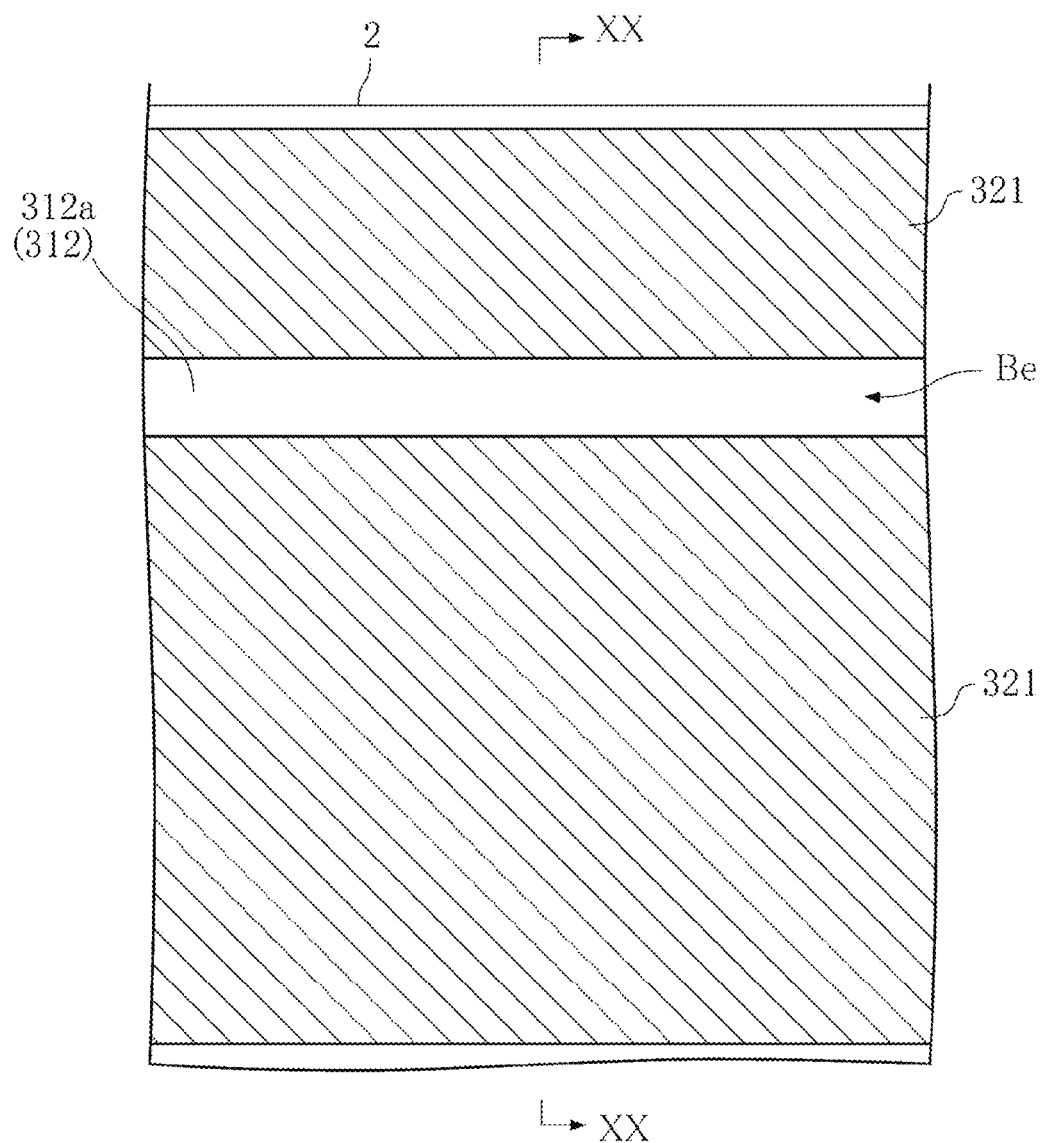
FIG. 19 is a diagram showing a step subsequent to the step shown in FIG. 18.
Figure 20:
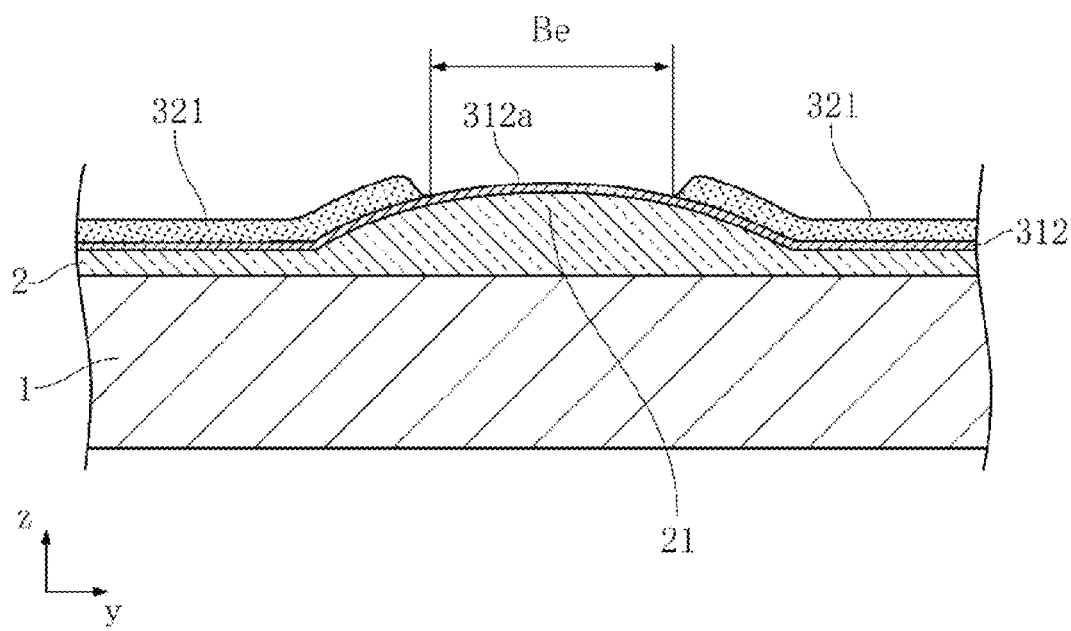
FIG. 20 is a diagram showing the main parts along line XX-XX in FIG. 19.

After forming the first layer 312, the process of printing the second paste material 321 on the first layer 312 is performed as shown in FIGS. 19 and 20. In this process, the second paste material 321 is printed so as to expose some portions of the first layer 312 at a position near the top of the protruding portion 21 of the glaze layer 2. In FIG. 19, for the sake of convenience, a diagonal line is referred to the region where the second paste material 321 is printed. As shown in FIG. 19, the second paste material 321 is printed so as to cover the glaze layer 2 and the most of the first layer 312 except for the strip-shaped region Be elongated in the x direction. In the strip-shaped region Be, the exposed portion 312a of the first layer 312, which is exposed from the second paste material 321, becomes the exposed portion 310a subsequently.

Figure 21:
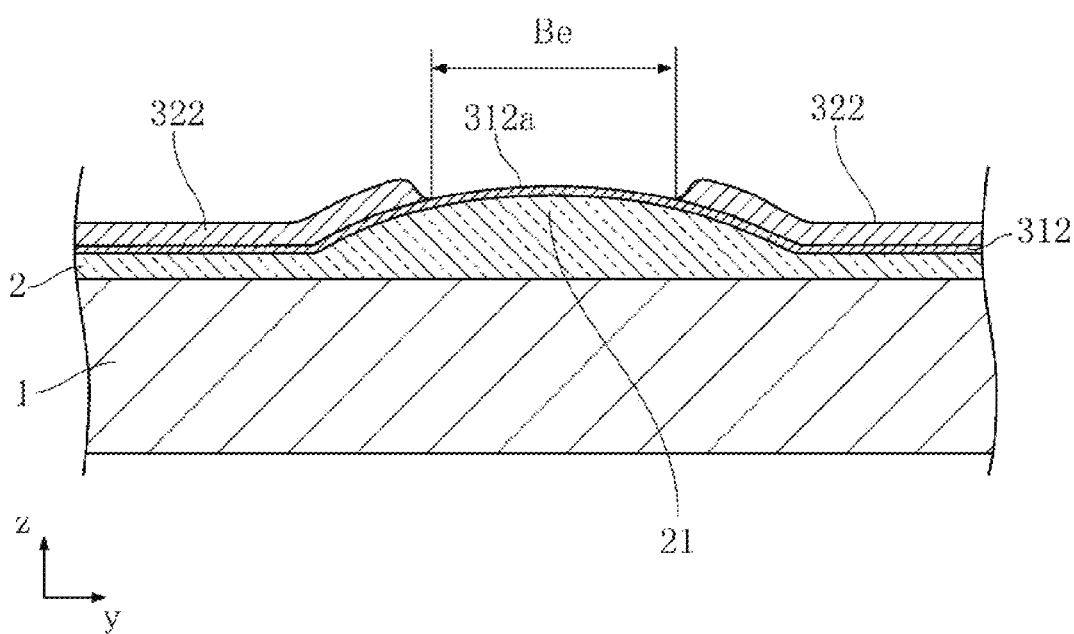
FIG. 21 is a diagram showing a step subsequent to the step shown in FIG. 19.
Figure 22:
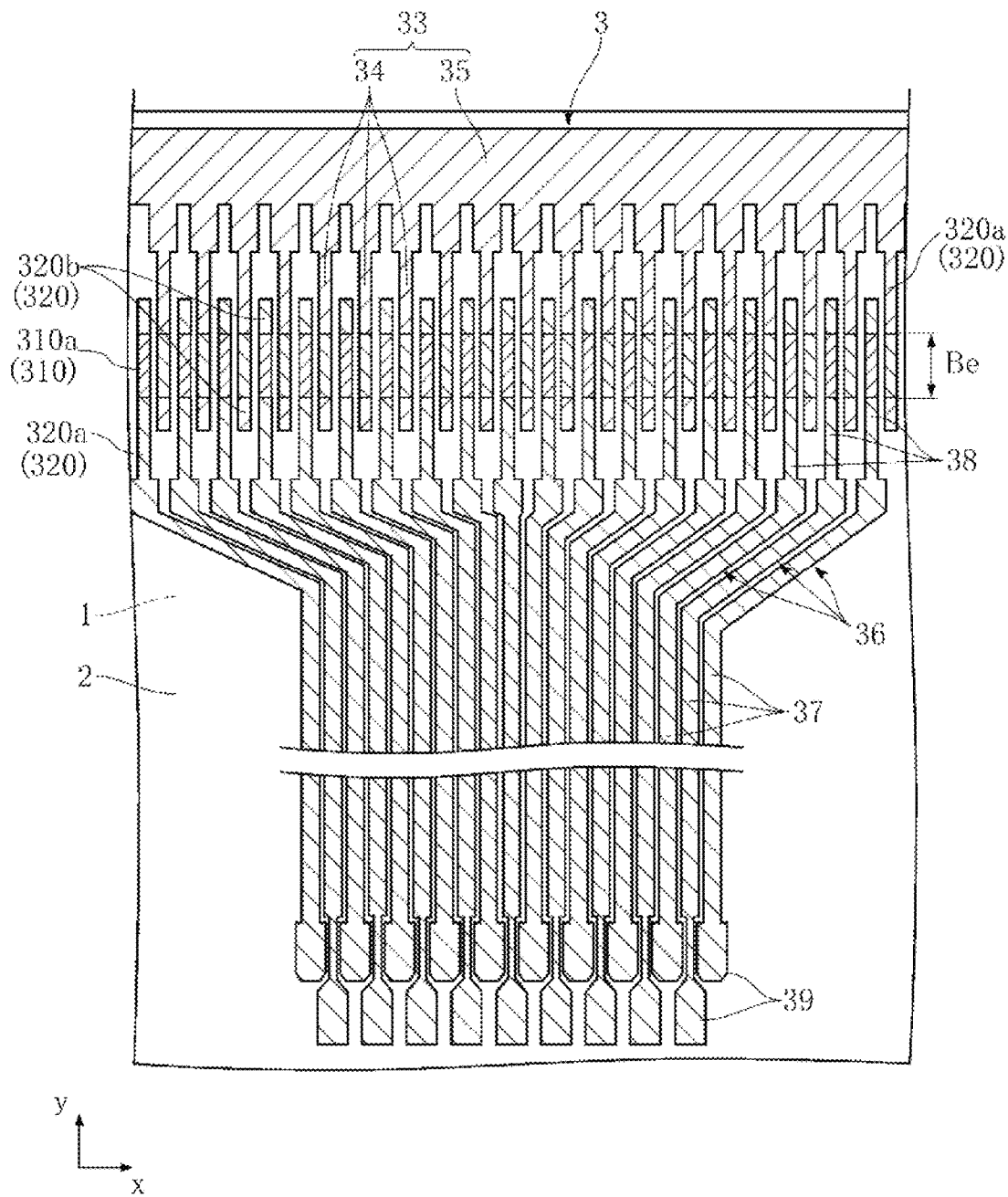
FIG. 22 is a diagram showing a state after performing a patterning by etching after the state shown in FIG. 21.

Next, a process of sintering the second paste material 321 is performed so as to form the second layer 322 shown in FIG. 21. The second layer 322 is mainly composed of the Ag—Pd alloy that the ratio of Ag is equal to or more than 80%. The patterning by the etching process is performed thereafter. FIG. 22 shows a state after performing the patterning by the etching process. With the etching process, the first layer 312 becomes the low thermal conduction layer 310, and the second layer 322 becomes the high electrical conduction layer 320. Further, the most of the second layer 322 becomes the body portion 320a, and a portion separated from the body portion 320a by the etching process becomes the separating portion 320b.

Specifically, the process of performing the etching process upon the first layer 312 and the second layer 322 includes a process of forming the plurality of strip-shaped portions 34 and 38 arranged toward the x direction. The strip-shaped portions 34 and 38 are formed so as to elongate in the y direction, respectively. Further, the strip-shaped portions 34 and 38 are formed so as to intersect the strip-shaped region Be in the y direction, respectively. According to the manufacturing method, the separating portion 320b remains in the front end of the strip-shaped portions 34 and 38.

Further, in the manufacturing method of the thermal print head A2, the resistor layer 4 is formed so as to contact with the first layer 312 exposed from the process of printing the second paste material 321, when forming the resistor layer 4.

Next, the actions of the thermal print head A2 will be described.

The electrode layer 3 of the present embodiment is also made of a material mainly composed of Ag. Therefore, for example, it is possible to reduce the manufacturing cost as compared with the configuration in which the electrode 3 is made of a material mainly composed of Au.

The electrode layer 3 in the present embodiment is configured by the low thermal conduction layer 310 and the high electrical conduction layer 320 having different Ag ratio. In the low thermal conduction layer 310 having relatively small Ag ratio, the electrical resistance becomes large at one side that the thermal conductivity is low. Thus, it is undesirable that the electrode layer 3 is configured by only the low thermal conduction layer 310. In the high electrical conduction layer 320 having relatively large Ag ration, the thermal conductivity is also high at one side that the electrical resistance is relatively small. From the viewpoint of suppressing the electrical resistance of the electrode layer 3, it is desirable that the electrode 3 is configured by the high electrical conduction layer 320. However, when the electrode 3 is configured by only the high electrical conduction layer 320, there is a problem as described below.

Because of the thermal conductivity of the high electrical conduction layer 320 is high, the heat emitted from the resistor layer 4 is easily escaped to the high electrical conduction layer 320 when the electrode layer 3 is configured by only the high electrical conduction layer 320. Therefore, there is the possibility that the time until accumulating sufficient heat for performing the print upon the resistor layer 4 becomes long, and the power consumption increases.

The configuration of the thermal print head A2 is intended to solve the problem described above. According to this embodiment, the low thermal conduction layer 310 is directly contacted to the resistor layer 4, and the high electrical conduction layer 320 is not directly contacted to the resistor layer 4. Therefore, the heat emitted from the resistor layer 4 is directly escaped to the low thermal conduction layer 310 that the thermal conductivity is relatively low, but is not directly escaped to the high electrical conduction layer 320. Thus, in the thermal print head A2, the heat from the resistor layer 4 is hardly escaped, so that the time until accumulating sufficient heat for performing the print upon the resistor layer 4 and the power consumption can be reduced. This is desirable to reduce the power consumption of the thermal print head A2.

Figure 23:
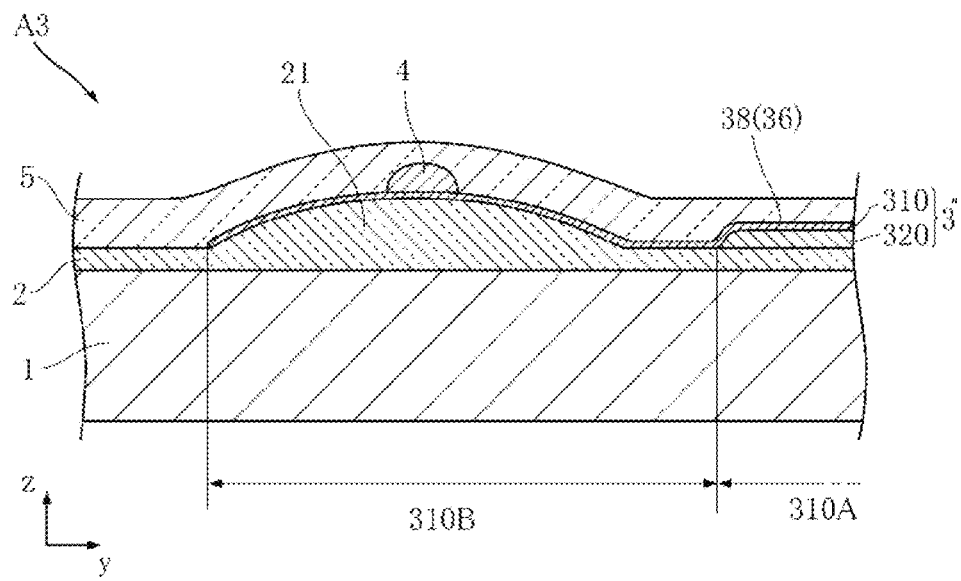
FIG. 23 is an enlarged cross-sectional view showing a thermal print head according to a third embodiment of the present disclosure.
Figure 24:
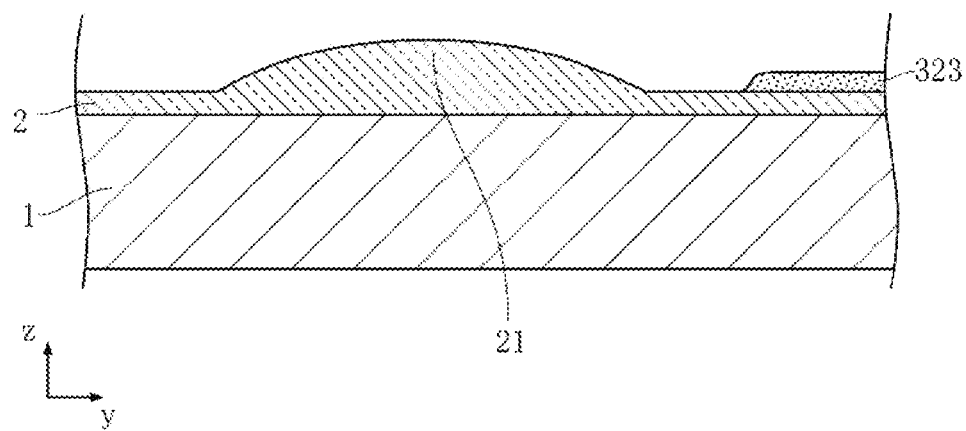
FIG. 24 is a diagram showing an example of a manufacturing step of the thermal print head shown in FIG. 23.
Figure 25:
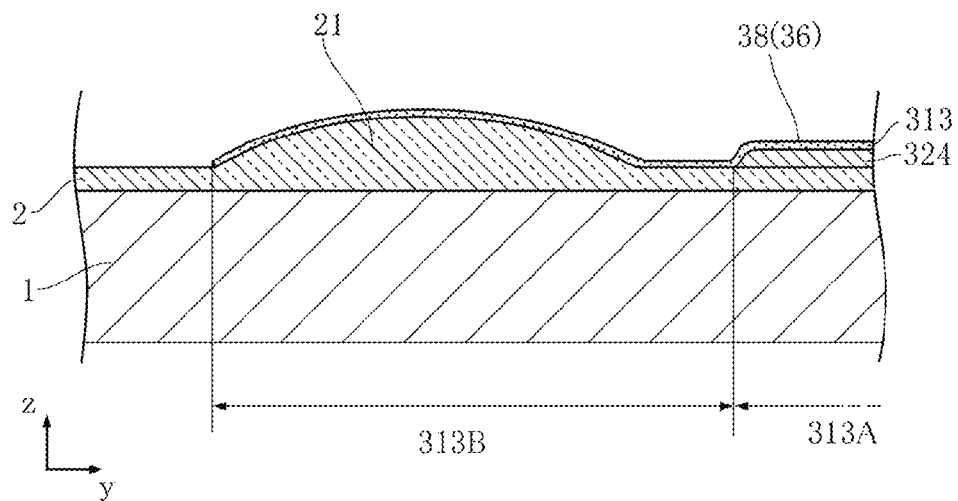
FIG. 25 is a diagram showing a step subsequent to the step shown in FIG. 24.
Figure 26:
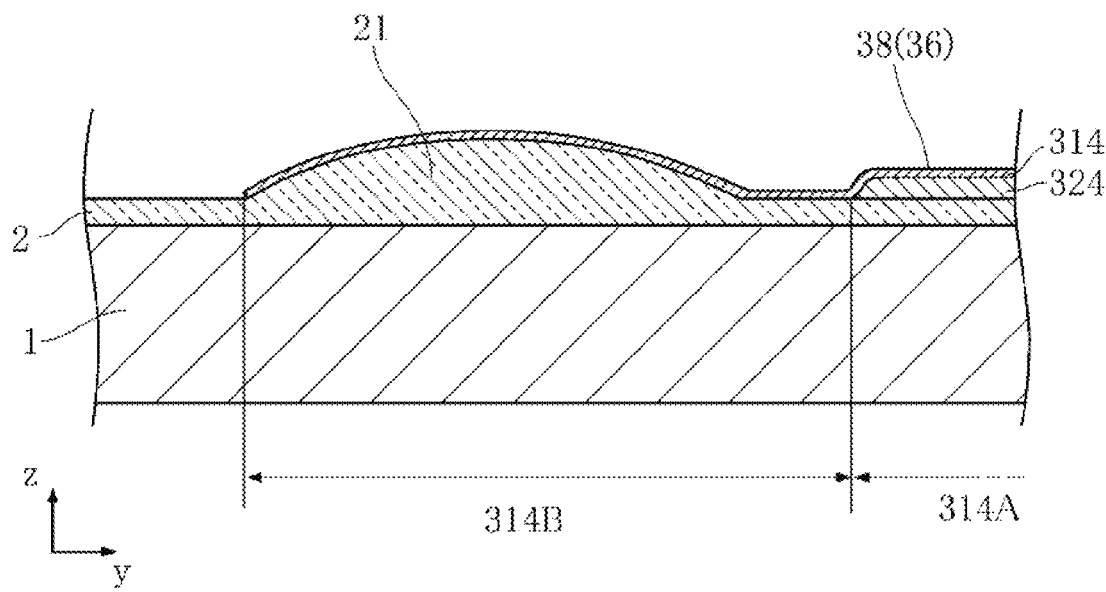
FIG. 26 is a diagram showing a step subsequent to the step shown in FIG. 25.

FIG. 23 shows a thermal print head according to a third embodiment of the present disclosure. The configuration of the electrode layer 3" in the thermal print head A3 of the present embodiment is different with the configuration of the electrode layer 3 in the thermal print head A2, and other configurations in the thermal print head A3 of the present embodiment are similar to other configurations in the thermal print head A2. FIGS. 24 to 26 show some portions of the manufacturing process of the thermal print head A3 shown in FIG. 23.

As shown in FIG. 23, according to the present embodiment, the low thermal conduction layer 310 includes a first region 310A formed on the high electrical conduction layer 320, and a second region 310B directly formed on the glaze layer 2 without overlapping with the high electrical conduction layer 320. The high electrical conduction layer 320 is formed on the glaze layer 2. The resistor layer 4 of the present embodiment is installed to contact with the second region 310B of the low thermal conduction layer 310.

When manufacturing the thermal print head A3 of the above configuration, a process of printing the first paste material 323 on the glaze layer 2 is performed after forming the glaze layer 2, as shown in FIG. 24. Further, the first paste material of the present embodiment is similar to the second paste material 321 in the thermal print head A2. The first layer 324 is formed as sintering the first paste material 323 (see FIG. 25) thereafter. The first layer 324 is mainly composed of the Ag—Pd alloy and the ratio of Ag is equal to or more than 80%.

Next, a process of printing the second paste material 313 to cover the first layer 324 is performed, as shown in FIG. 25. Further, the second paste material 313 of the present embodiment is similar to the first paste material 311 in the thermal print head A2. In this process, the second paste material 313 is also printed on some portions of the glaze layer 2. Therefore, the second paste material 313 includes a first region 313A printed on the first layer 324, and a second region 313B without overlapping with the first layer 324. After printing the second paste material 313, the sintering is performed upon the second paste material 313, so that the second layer 314 shown in FIG. 26 is formed. The second layer 314 is mainly composed of the Ag—Pd alloy and the ratio of Ag is equal to or more than 80%. The second layer 314 also includes a first region 314A formed on the first layer 324 and a second region 314B without overlapping with the first layer 324. The patterning by the etching process is performed upon the first layer 324 and the second layer 314 thereafter. After the etching process, a lower portion of the first region 314A becomes the first region 310A, and a lower portion of the second region 314B becomes the second region 310B.

The thermal print head A3 of the present embodiment also have a configuration that the high electrical conduction layer 320 having relatively high thermal conductivity is not directly contacted with the resistor layer 4, so that the heat from the resistor layer 4 is hardly escaped. Therefore, it is suitable to reduce the power consumption of the thermal print head A3 as the thermal print head A2.

The manufacturing method of the fine wiring pattern, the fine wiring pattern, and the thermal print head according to the present disclosure are not limited to the above embodiments. Modifications and variations can be made to the specific construction of the manufacturing method of the fine wiring pattern, the fine wiring pattern, and the thermal print head according to the present disclosure.

With the above-described configuration, the electrode layer is made of a material mainly composed of Ag. Therefore, it is possible to reduce the manufacturing cost as compared with the configuration in which the electrode layer is made of a material mainly composed of Au.

While certain embodiments have been described, these embodiments have been presented by way of example only, and are not intended to limit the scope of the inventions. Indeed, the embodiments herein may be embodied in a variety of other forms. Furthermore, various omissions, substitutions and changes in the form of the embodiments described herein may be made without departing from the spirit of the inventions. The accompanying claims and their equivalents are intended to cover such forms or modifications which would fall within the scope and spirit of the inventions.

What is claimed is:

1. A manufacturing method of a wiring pattern, comprising:
   preparing a support member;
   forming a glaze layer with a thermal effect on the support member;
   forming a first layer on the support member and the glaze layer;
   forming a second layer including silver on the first layer;
   forming a predetermined wiring pattern by performing an etching process on the first layer and the second layer, and
   bonding a wire to the second layer.

2. The manufacturing method of claim 1, wherein the wiring pattern includes a plurality of wire portions, and a space between the adjacent wire portions is equal to or less than 40 µm.

3. The manufacturing method of claim 1, wherein at least one portion of the wiring pattern has a wiring width of 25 µm or smaller.

4. The manufacturing method of claim 1, wherein the first layer and the second layer include silver.

5. The manufacturing method of claim 1, wherein the first layer is formed thinner than the second layer.

6. The manufacturing method of claim 5, wherein the first layer includes palladium.

7. The manufacturing method of claim 5, wherein the first layer and the second layer include palladium, and a palladium content of the first layer is larger than a palladium content of the second layer.

8. The manufacturing method of claim 1, wherein the support member includes a substrate made of a ceramic and the glaze layer formed on the substrate of the support member.

9. The manufacturing method of claim 1, wherein the second layer includes silver particles.

10. The manufacturing method of claim 9, wherein the second layer includes a glass.

11. The manufacturing method of claim 9, wherein the first layer includes an organic silver compound.

12. A wiring pattern formed by the manufacturing method of fine wiring pattern according to claim 1.

13. A thermal print head including a wiring pattern according to claim 12.

14. The thermal print head of claim 13, further comprising:
a drive IC; and
a wire for connecting the drive IC and the wiring pattern, wherein the wire is made of gold.

15. A manufacturing method of a fine wiring pattern, comprising:
preparing a support member;
forming a first layer on the support member by thick-film printing;
forming a second layer including silver on the first layer by thick-film printing; and
forming a predetermined fine wiring pattern by performing an etching process on the first layer and the second layer,
wherein the first layer and the second layer include silver,
wherein the first layer is formed using a first paste material including silver in a first ratio,
wherein forming the second layer includes installing a second paste material including silver in a second ratio on the first layer to expose some portions of the first layer, and
wherein the second ratio is larger than the first ratio.

16. The manufacturing method of claim 15, wherein the first layer includes a silver-palladium alloy, and the ratio of silver is equal to or less than 80%, and
wherein the second layer includes a silver-palladium alloy, and the ratio of silver is equal to or more than 80%.

17. The manufacturing method of claim 16, wherein performing the etching process includes forming a plurality of strip-shaped portions arranged along a first direction, and
in forming the second layer, the first layer is exposed in a strip-shaped region extended in the first direction.

18. The manufacturing method of claim 17, wherein the plurality of strip-shaped portions is formed to intersect the strip-shaped region in a second direction perpendicular to the first direction.

19. A manufacturing method of a fine wiring pattern, comprising:
preparing a support member;
forming a first layer on the support member by thick-film printing;
forming a second layer including silver on the first layer by thick-film printing; and
forming a predetermined fine wiring pattern by performing an etching process on the first layer and the second layer,
wherein the first layer and the second layer include silver,
wherein forming the first layer is performed by using a first paste material including silver in a first ratio,
wherein forming the second layer includes installing a second paste material including silver in a second ratio on a region that is not covered by the first layer on the support member, and
wherein the second ratio is smaller than the first ratio.

20. The manufacturing method of claim 19, wherein the first layer includes a silver-palladium alloy and the ratio of silver is equal to or more than 80%, and
wherein the second layer includes a silver-palladium alloy and the ratio of silver is equal to or less than 80%.

21. A method of manufacturing a thermal print head, comprising:
preparing a driving IC for controlling a temperature of a glaze layer;
bonding a wire to an electrode of the drive IC;
preparing a support member;
forming the glaze layer with a thermal effect on the support member;
forming a first layer on the support member and the glaze layer;
forming a second layer including silver on the first layer;
forming a predetermined wiring pattern by performing an etching process on the first layer and the second layer; and
bonding a wire to the second layer,
wherein the wire bonded to the electrode of the drive IC is coupled to the wire bonded to the second layer.

22. The method of claim 21, further comprising:
forming a protection layer to cover the glaze layer and the second layer.

23. The method of claim 21, wherein a common electrode is separated from the second layer and formed on the support member and the glaze layer.

24. The method of claim 21, wherein at least a portion of the wiring pattern is formed to be curved with respect to the support member.

* * * * *